United States Patent
Wakabayashi et al.

(10) Patent No.: US 8,804,780 B2
(45) Date of Patent: Aug. 12, 2014

(54) METHOD FOR ADJUSTING SPECTRAL LINE WIDTH OF NARROW-BAND LASER

(75) Inventors: Osamu Wakabayashi, Hiratsuka (JP); Takahito Kumazaki, Hiratsuka (JP); Toru Suzuki, Oyama (JP); Masashi Shinbori, Yokohama (JP); Masaya Yoshino, Oyama (JP)

(73) Assignees: Komatsu Ltd., Tokyo (JP); Ushio Denki, Tokyo (JP)

( * ) Notice: Subject to any disclaimer, the term of this patent is extended or adjusted under 35 U.S.C. 154(b) by 0 days.

(21) Appl. No.: 11/822,126

(22) Filed: Jul. 2, 2007

(65) Prior Publication Data

US 2008/0181262 A1    Jul. 31, 2008

(30) Foreign Application Priority Data

Jul. 4, 2006 (JP) .................................. 2006-184425

(51) Int. Cl.
*H01S 3/13* (2006.01)
*H01S 3/137* (2006.01)

(52) U.S. Cl.
CPC ..................................... *H01S 3/137* (2013.01)
USPC ........................................ 372/29.02; 372/55

(58) Field of Classification Search
CPC ..... H01S 3/0014; H01S 3/005; H01S 3/0057; H01S 3/13; H01S 3/1398; H01S 3/0078
USPC ................................. 372/29.02, 55
See application file for complete search history.

(56) References Cited

U.S. PATENT DOCUMENTS

| | | | | |
|---|---|---|---|---|
| 4,698,816 | A | * | 10/1987 | Chun .............................. 372/19 |
| 5,142,543 | A | * | 8/1992 | Wakabayashi et al. ......... 372/32 |
| 5,661,547 | A | * | 8/1997 | Aketagawa et al. ............ 355/53 |

(Continued)

FOREIGN PATENT DOCUMENTS

| | | |
|---|---|---|
| JP | 01-191489 | 8/1989 |
| JP | 1-239923 | 9/1989 |

(Continued)

OTHER PUBLICATIONS

Japanese Office Action (with English translation) issued on May 13, 2011 in the counterpart Japanese Patent Application No. 2006-184425.

(Continued)

*Primary Examiner* — Tod T Van Roy
*Assistant Examiner* — Joshua King
(74) *Attorney, Agent, or Firm* — Wenderoth, Lind & Ponack, LLP

(57) ABSTRACT

An upper limit and a lower limit are preliminarily set for a spectral line width common to a plurality of narrow-band laser devices. When delivered or subjected to maintenance, the narrow-band laser device is caused to laser oscillate to detect its spectral line width before it is used as a light source for semiconductor exposure. A spectral line width adjustment unit provided in the narrow-band laser device is adjusted so that the spectral line width assumes a value between the upper limit and the lower limit. The present invention is able to suppress the variation in spectral line width such as E95 bandwidth caused by machine differences during the manufacture of the laser device, or by replacement or maintenance of the laser device, whereby the quality of integrated circuit patterns formed by the semiconductor exposure tool can be stabilized.

19 Claims, 23 Drawing Sheets

(56) References Cited

U.S. PATENT DOCUMENTS

| | | | | |
|---|---|---|---|---|
| 5,970,082 A * | 10/1999 | Ershov | .......................... | 372/102 |
| 6,381,257 B1 * | 4/2002 | Ershov et al. | ................... | 372/57 |
| 6,393,037 B1 * | 5/2002 | Basting et al. | .................. | 372/20 |
| 6,490,306 B2 * | 12/2002 | Stamm et al. | .................... | 372/57 |
| 6,499,007 B1 | 12/2002 | Kuroki et al. | | |
| 6,526,086 B1 * | 2/2003 | Wakabayashi et al. | ......... | 372/69 |
| 6,721,340 B1 | 4/2004 | Fomenkov et al. | | |
| 7,957,449 B2 | 6/2011 | Wakabayashi et al. | | |
| 8,116,347 B2 | 2/2012 | Wakabayashi et al. | | |
| 2002/0141471 A1 * | 10/2002 | Aab et al. | ......................... | 372/57 |
| 2002/0167975 A1 * | 11/2002 | Spangler et al. | ................. | 372/20 |
| 2004/0057474 A1 * | 3/2004 | Fomenkov et al. | ............. | 372/20 |
| 2006/0170899 A1 * | 8/2006 | De Kruif et al. | ................. | 355/69 |
| 2007/0014326 A1 * | 1/2007 | Wakabayashi et al. | .......... | 372/92 |
| 2007/0091968 A1 | 4/2007 | Wakabayashi et al. | | |
| 2007/0297483 A1 | 12/2007 | Wakabayashi et al. | | |
| 2011/0216800 A1 | 9/2011 | Wakabayashi et al. | | |
| 2012/0224600 A1 | 9/2012 | Wakabayashi et al. | | |

FOREIGN PATENT DOCUMENTS

| | | |
|---|---|---|
| JP | 01-251771 | 10/1989 |
| JP | 1-274152 | 11/1989 |
| JP | 10-313143 | 11/1998 |
| JP | 11-274632 | 10/1999 |
| JP | 2000-040654 | 2/2000 |
| JP | 2000-312048 | 11/2000 |
| JP | 2000-357837 | 12/2000 |
| JP | 2001-168421 | 6/2001 |
| JP | 2001-267673 | 9/2001 |
| JP | 2002-124456 | 4/2002 |
| JP | 2006-24855 | 1/2006 |
| WO | 2004/095661 | 11/2004 |

OTHER PUBLICATIONS

Refusing Reason Notice (with English translation) issued Feb. 7, 2012 in corresponding Japanese Application No. 2006-184425.
Decision of Rejection issued Feb. 4, 2014, in corresponding Japanese Application No. 2011-152861 (with English translation).

* cited by examiner

METHOD FOR ADJUSTING SPECTRAL LINE WIDTH OF NARROW-BAND LASER

BACKGROUND OF THE INVENTION

1. Field of the Invention

The present invention relates to a method for adjusting a spectral line width such as E95 bandwidth of a narrow-band laser when using a narrow-band laser as a light source to expose a semiconductor. The E95 bandwidth means a spectral line width of the spectral area of laser light where 95% energy is concentrated. The present invention particularly relates to a method for reducing the deviation in spectral line width such as E95 bandwidth among a plurality of narrow-band laser devices.

2. Description of the Related Art

The recent trend of refining the configuration and increasing the degree of integration of semiconductor integrated circuits has increased the demand for improvement in resolution of a semiconductor exposure tool (hereafter, referred to as the "exposure tool"). For this purpose, the related art tries to decrease the wavelength of light emitted by an exposure light source. Recently, a gas laser device has replaced a traditional mercury lamp as an exposure light source. Such a gas laser device for exposure is for example a KrF excimer laser emitting vacuum ultraviolet light with a wavelength of 248 nm or an ArF excimer laser emitting vacuum ultraviolet light with a wavelength of 193 nm.

Studies are being conducted for next-generation exposure technologies, represented by an immersion exposure technique in which space between a wafer and an exposure lens of an exposure tool is filled with liquid to change the index of refraction to thereby decrease the apparent wavelength of the exposure light source. When the immersion exposure is performed by using an ArF excimer laser as an exposure light source, the wafer is irradiated with vacuum ultraviolet light with a wavelength of 134 nm in the liquid. This technique is referred to as the ArF immersion exposure (or ArF immersion lithography).

A next-next generation exposure light source which is viewed with high degree of expectation is an F2 laser emitting vacuum ultraviolet light with a wavelength of 157 nm. Further, the F2 laser is possibly used as an exposure light source to perform the immersion technique as described above. It is believed that, in this case, a wafer is irradiated with vacuum ultraviolet light with a wavelength of 115 nm.

KrF and ArF excimer lasers have a free running line width as wide as about 350 to 400 pm. The use of these projection lens will cause occurrence of chromatic aberration, resulting in lose of resolution. Therefore, it is necessary to narrow the spectral line width of laser light emitted by the gas laser device until the chromatic aberration is reduced to a negligible level. For this reason, a line narrowing module having a line narrowing element (e.g. etalon or grating) is provided in a laser resonator of the gas laser device, so that the spectral line width is narrowed. A laser whose spectral line width is narrowed is referred to as the "narrow-band laser". In general, a laser spectral line width is represented by a full width at half maximum. As shown in FIG. 22($a$), the term "full width at half maximum (FWHM)" refers to a spectral line width of a part of the laser light spectral where the light intensity is a half of the peak value.

The image formation performance of an exposure tool can be accurately evaluated by an optical simulation calculation method using optical system data of the exposure tool and laser spectral profile. It is known from the results of the optical simulation calculation that the image formation performance of an exposure tool is greatly affected not only by the full width at half maximum of laser light spectral but also by components in the spectral skirts. Therefore, a new definition called E95 bandwidth (also referred to as spectral purity width) has been introduced to define a spectral line width. As shown in FIG. 22($b$), the E95 bandwidth is an index indicating a spectral line width of a part of spectral area of laser light where 95% of energy is concentrated. There is a correlation between the E95 bandwidth and image formation performance of an optical system of the exposure tool. The E95 bandwidth is thus required to be suppressed to 0.5 pm or less in order to guarantee a high quality for integrated circuits produced.

The E95 bandwidth and the spectral line width at full width at half maximum can be varied for example by changing the wavefront of laser light. One of techniques to change the laser light wavefront is disclosed in the Patent Document 1 (Japanese Patent Application Laid-Open No. 2000-312048) which relates to a device for changing the curvature of a grating.

However, it has recently been made known that if the value of the E95 bandwidth or the spectral line width at full width at half maximum is either too large or too small in comparison with a designed value for the optical system of the exposure tool, the quality of the integrated circuit pattern is deteriorated. This is described in the Patent Document 2 (U.S. Pat. No. 6,721,340) and the Patent Document 3 (Japanese Patent Application Laid-Open No. 2001-267673).

When a plurality of laser devices are compared, those laser devices do not necessarily have an equivalent spectral line width such as E95 bandwidth even if they have the same configuration. It is rather common that the spectral line width such as E95 bandwidth differs among the plurality of laser devices. FIG. 23 is a histogram showing the E95 bandwidths in a plurality of conventional laser devices. As shown in FIG. 23, the maximum value of E95 bandwidth was 0.450 pm, the minimum value 0.210 pm, the mean value 0.340 pm, and the standard deviation was 0.061 pm. Five out of twenty devices exhibited a variation in the E95 bandwidth exceeding an allowable range of the E95 bandwidth for an optical system of an exposure tool, for example a range of from 0.350 to 0.450 pm. The result revealed that if these five laser devices having an E95 bandwidth exceeding the allowable range were used as an exposure light source, the quality of integrated circuit patterns was deteriorated to such an extent that it is impossible to produce a semiconductor device.

It is believed that the spectral line width such as E95 bandwidth differs among laser devices due to machine differences thereof. The machine differences among laser devices include the followings.

(1) Individual differences among optical elements (line narrowing elements) such as:
 i) variation in diffractive wavefront of gratings;
 ii) variation in transmission wavefront of prisms; and
 iii) variation in position and optical axis among optical elements in a line narrowing module;

(2) Machine differences in adjustment of laser optical axis such as:
 i) variation in chamber discharge position and optical axis when chambers are replaced;
 ii) variation in position and optical axis among line narrowing modules;
 iii) variation in optical axis among laser resonators;

(3) Machine differences of laser chambers such as:
 i) variation in discharge position
 ii) variation in discharge position and discharge state.

In a practical exposure process of semiconductor device manufacture, laser devices or modules are replaced due to failure or end of service life of the devices. Due to the machine differences as described above, a replacing laser device will have a different spectral line width such as E95 bandwidth from that of a replaced laser device even if they are of a same type. Moreover, the spectral line width such as E95 bandwidth will vary even in a same laser device between before and after maintenance thereof. This means that the spectral line width such as E95 bandwidth is changed as a result of replacement or maintenance of the laser device, and if such change exceeds an allowable range of the spectral line width such as E95 bandwidth for an optical system of the exposure tool, the quality of integrated circuit patterns is deteriorated to such an extent that it is impossible to manufacture a semiconductor device.

The present invention has been made in view of the circumstances described above. It is an object of the prevent invention to suppress variation in spectral line width such as E95 bandwidth due to machine differences caused during manufacture of laser devices and variation in spectral line width such as E95 bandwidth caused by replacement of maintenance of a laser device, and thus to stabilize the quality of integrated circuit patterns formed by a semiconductor exposure tool.

SUMMARY OF THE INVENTION

A first aspect of the invention provides a narrow-band laser spectral line width adjustment method for adjusting the spectral line width of laser light when a narrow-band laser is used as a light source for semiconductor exposure, the method comprising the steps of: setting an upper limit and a lower limit for a spectral line width common to a plurality of narrow-band laser devices; causing the narrow-band laser device to laser oscillate prior to semiconductor exposure to detect a spectral line width; and adjusting a spectral line width adjustment unit provided in the narrow-band laser device to adjust the spectral line width to be a value between the upper limit and the lower limit.

According to the first aspect of the invention, an upper limit and a lower limit are preliminarily set for a spectral line width common to a plurality of narrow-band laser devices. When delivered or subjected to maintenance, the narrow-band laser device is caused to laser oscillate to detect its spectral line width before it is used as a light source for semiconductor exposure. A spectral line width adjustment unit provided in the narrow-band laser device is adjusted so that the spectral line width assumes a value between the upper limit and the lower limit. This makes it possible, even if the narrow-band laser device is replaced with another one before semiconductor exposure, to minimize the difference in spectral line width between the replaced narrow-band laser device and the replacing narrow-band laser device. Further, even if the narrow-band laser device is subjected to maintenance before conducting semiconductor exposure, the difference in spectral line width of the narrow-band laser device between before and after the maintenance can be minimized.

In a second aspect of the invention according to the first aspect, the spectral line width adjustment unit has a wavefront adjuster which is arranged on an optical path inside a laser resonator of the narrow-band laser device, and is designed to adjust the curvature radius of an optical wavefront with a straight line connecting the apex of the cylindrical shape of the optical wavefront being set substantially perpendicular to the wavefront dispersion surface of a wavelength selection element arranged inside the laser resonator of the narrow-band laser device, and the wavefront adjuster is adjusted so that the spectral line width assumes a value between the upper limit and the lower limit.

In a third aspect of the invention according to the second aspect, the spectral line width adjustment unit includes: a cylindrical concave lens and cylindrical convex lens whose central axes are arranged on the optical path inside the laser resonator of the narrow-band laser device and whose mechanical axes are arranged substantially perpendicular to the wavefront dispersion surface of the wavelength selection element arranged inside the laser resonator; and a lens distance variable mechanism for varying the distance between the cylindrical concave lens and the cylindrical convex lens along the optical path, and the lens distance variable mechanism is adjusted so that the spectral line width assumes a value between the upper limit and the lower limit.

In a fourth aspect of the invention according to the second aspect, the spectral line width adjustment unit includes: a cylindrical mirror whose central axis is arranged on the optical path inside the laser resonator of the narrow-band laser device, and whose mechanical axis is arranged substantially perpendicular to the wavefront dispersion surface of the wavelength selection element arranged inside the laser resonator; and a mirror curvature variable mechanism for varying a curvature of the cylindrical mirror, and the mirror curvature variable mechanism is adjusted so that the spectral line width assumes a value between the upper limit and the lower limit.

In a fifth aspect of the invention according to the second aspect, the spectral line width adjustment unit includes: a grating used as the wavelength selection element; and a grating curvature variable mechanism for varying a curvature of the grating while keeping a linear shape of a multiplicity of grooves of the grating, and the grating curvature variable mechanism is adjusted so that the spectral line width assumes a value between the upper limit and the lower limit.

In a sixth aspect of the invention according to the first aspect, the spectral line width adjustment unit includes: two or more prisms arranged on an optical path inside a laser resonator of the narrow-band laser device for expanding a beam in a direction substantially perpendicular to the wavefront dispersion surface of a wavelength selection element arranged inside the laser resonator; and a prism angle variable mechanism for varying a rotation angle of the two or more prisms to change a beam expansion factor, and the prism angle variable mechanism is adjusted so that the spectral line width assumes a value between the upper limit and the lower limit.

The third to sixth aspects of the invention each relate to a specific method of adjusting the spectral line width in the first aspect of the invention.

In a seventh aspect of the invention according to the first aspect, the narrow-band laser device includes an oscillation stage laser for generating and outputting seed light, and one or more amplification stage chambers or amplification stage lasers for receiving and amplifying the laser light output from a previous stage laser, and outputting the amplified laser light; and the spectral line width adjustment unit includes a spectral line width variable mechanism arranged on a laser optical path between the oscillation stage laser and the amplification stage chamber or the amplification stage laser, and the spectral line width variable mechanism is adjusted so that the spectral line width assumes a value between the upper limit and the lower limit.

The seventh aspect of the invention relates to a specific method of adjusting the spectral line width when the narrow-band laser device is a double-chamber system having an oscillation stage and an amplification stage in the first aspect.

In an eighth aspect of the invention according to the first aspect, the narrow-band laser device includes an oscillation stage laser for generating and outputting seed light, and one or more amplification stage chambers or amplification stage lasers for receiving and amplifying the laser light output from a previous stage laser, and outputting the amplified laser light; and the spectral line width adjustment unit includes a spectral line width variable mechanism arranged on a laser optical path inside a laser resonator of the oscillation stage laser, and the spectral line width variable mechanism is adjusted so that the spectral line width assumes a value between the upper limit and the lower limit.

The eighth aspect of the invention relates to a specific method for adjusting the spectral line width when the narrow-band laser device is a double-chamber system having an oscillation stage and an amplification stage in the first aspect.

The present invention is able to minimize the deviation in spectral line width such as E95 bandwidth among laser devices can be minimized, and the deviation in spectral line width such as E95 bandwidth of a same laser device between before and after it is subjected to maintenance. Therefore, the spectral line width of laser light output by the laser device does not exceed the allowable range of spectral line width such as E95 bandwidth for an optical system of the exposure tool. This makes it possible to stabilize the quality of integrated circuit patterns formed by the semiconductor exposure tool and thus improves the yield of semiconductor devices. Furthermore, the yield of laser production and the yield in maintenance are improved, whereby the laser production cost and the maintenance cost can be reduced effectively.

DETAILED DESCRIPTION OF THE INVENTION

Preferred embodiments of the present invention will be described with reference to the accompanying drawings. While the spectral line width includes several types such as FWHM and E95, the following description will be made taking the E95 bandwidth as an example.

Figure 1:
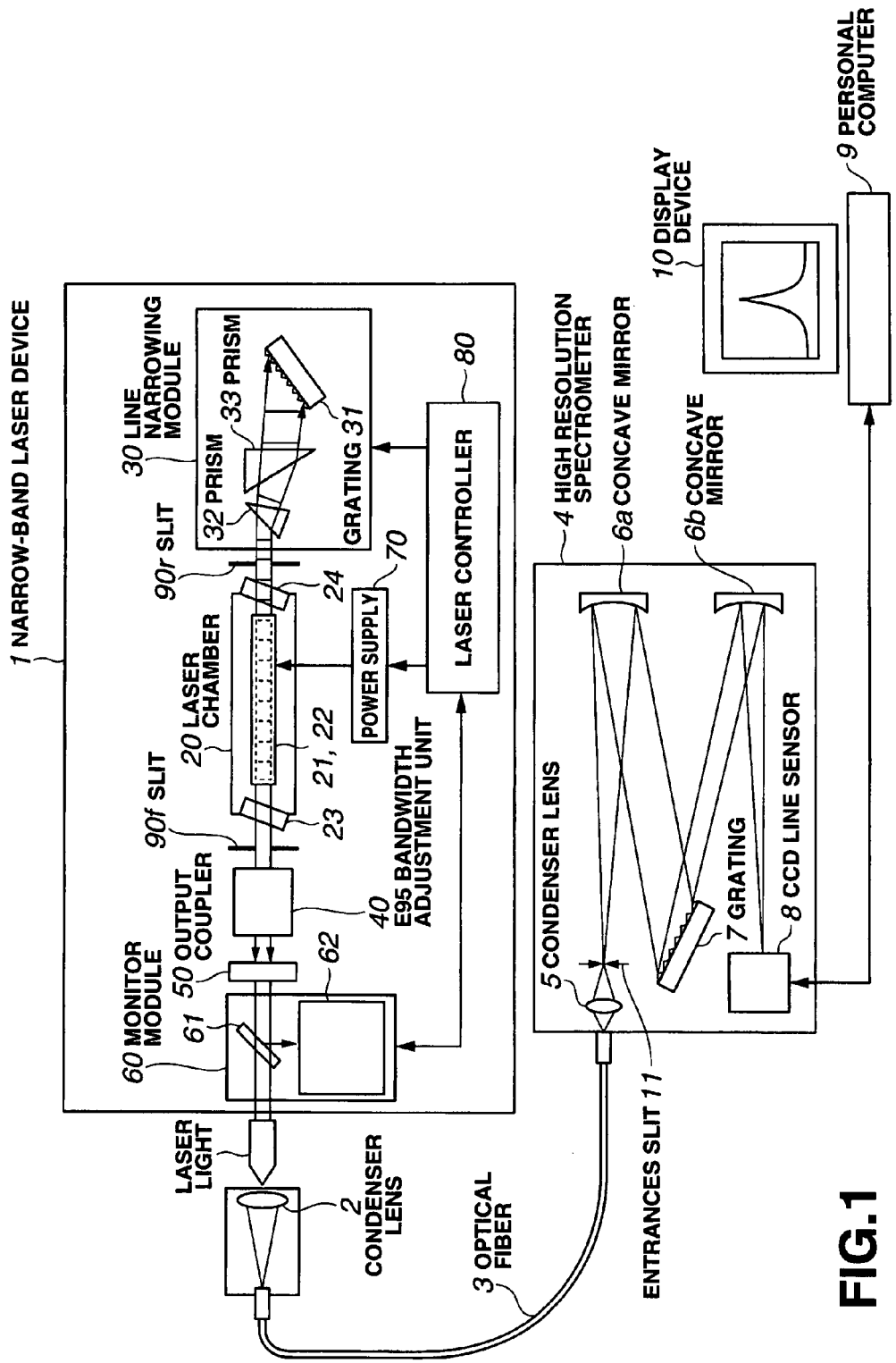
FIG. 1 is a diagram showing an example of a device configuration for adjusting a spectral line width of a narrow-band laser device.

FIG. 1 shows an example of a device configuration for adjusting the spectral line width of a narrow-band laser device.

In a narrow-band laser device 1 as shown in FIG. 1, a slit 90r and a line narrowing module 30 are arranged on an optical path on the rear side (the right side in the drawing) of a laser chamber 20, and a slit 90f and an E95 bandwidth adjustment unit 40 are arranged on an optical path on the front side (on the left side in the drawing) of the laser chamber 20. Further, a monitor module 60 and an output coupler 50 having an incidence surface coated with a PR film and an emission surface coated with an AR film are arranged on an optical path on the front side (the left side in the drawing) of the E95 bandwidth adjustment unit 40. The line narrowing module 30 and the output coupler 50 together form a resonator.

A pair of discharge electrodes 21 and 22 are provided in the inside of the laser chamber 20. The discharge electrodes 21 and 22 are arranged parallel to each other in the longitudinal direction thereof, and such that the discharge surfaces thereof face each other, being spaced from each other by a predetermined distance. Further, windows 23 and 24 are provided in a laser light output portion on the optical axis of laser light in the laser chamber 20. The windows 23 and 24 are made of a material having transparency to laser light such as CaF2. The windows 23 and 24 are arranged such that the outer surfaces thereof are parallel to each other, and arranged at a Brewster angle to reduce the reflection loss of laser light.

Laser gas is sealed inside the laser chamber 20 as a laser medium. The laser gas used in the case of F2 laser is gas mixture composed of F2 gas and a buffer gas such as He or Ne. The laser gas used in the case of KrF excimer laser is gas mixture composed of Kr gas, F2 gas, and a buffer gas such as He or Ne. The laser gas used in the case of ArF excimer laser is gas mixture composed of Ar gas, F2 gas, and a buffer gas such as He or Ne. The supply and discharge of the laser gas is controlled by a gas supply/discharge mechanism (not shown).

High voltage is applied by a power supply circuit 70 to the discharge electrodes 21 and 22 provided in the laser chamber 20. Electric discharge occurs when the voltage between the discharge electrodes 21 and 22 exceeds a predetermined voltage. The laser gas in the laser chamber 20 is excited by the electric discharge to shift to a high energy level and then to a low energy level, resulting in emission of light.

There are provided in the line narrowing module 30 optical elements such as prism beam expanders (hereafter, each referred to as the "prism") 32 and 33 and a grating 31 serving as a wavelength dispersive element. Although two prisms are provided in the example shown in FIG. 1, the number of the prisms can be determined arbitrarily. The grating 31 and the prisms 32 and 33 are usually fixed to a casing of the line narrowing module 30 by means of a fixing member. However, in some cases, they may be fixed rotatably. In such a case, the prisms 32 and 33 and the grating 31 are fixed to a rotation mechanism not shown in the drawing. The incident angle of laser light to the grating 31 and the prisms 32 and 33 is changed by driving the rotation mechanism. Further, the line narrowing module 30 may be formed of optical elements such as a total reflection mirror and an etalon serving as a wavelength dispersive element.

The E95 bandwidth adjustment unit 40 is composed of optical elements for adjusting the E95 bandwidth of laser light. The E95 bandwidth adjustment unit 40 can be configured in several manners, which will be described later with reference to FIGS. 2(a) and 2(b) to FIG. 21.

The monitor module 60 is provided with a beam splitter 61 and a monitor 62. The monitor 62 is comprised of a monitor for detecting an E95 bandwidth or central wavelength and a monitor for detecting laser light energy. The monitor for detecting an E95 bandwidth or central wavelength includes a spectrometer having, for example, a diffuser panel, an etalon, a condenser lens, a line sensor and so on. Laser light entering the monitor module 60 is split by the beam splitter 61 so that part of the laser light enters the monitor 62 while the rest is emitted to the outside.

A laser controller 80 calculates energy, wavelength, and spectral line width of laser light based on a spectral detected by the monitor 62 of the monitor module 60. Based on the calculation results, the laser controller 80 outputs a command signal indicating a charging voltage of the power supply circuit 70, and a command signal for driving the rotation mechanism to which the optical elements of the line narrowing module 30 are fixed.

There are provided, in the outside of the narrow-band laser device 1, a high resolution spectrometer 4 for detecting the spectral of laser light output by the narrow-band laser device 1, a condenser lens 2 and an optical fiber 3 for guiding laser light from the narrow-band laser device to the high resolution spectrometer 4, and a personal computer 9 for retrieving the detection result from the high resolution spectrometer 4 and displaying the spectral of the laser light on a display device.

The laser light emitted by the narrow-band laser device 1 is collected by the condenser lens 2. The light emitted by the condenser lens 2 passes through the optical fiber 3 and enters the high resolution spectrometer 4. In the high resolution spectrometer 4, the light passes through the condenser lens 5 and illuminates an entrance slit 11. Light transmitted through the entrance slit is reflected by a concave mirror 6a, diffracted by a grating 7, and reflected by a concave mirror 6b. A diffraction image is thus formed on a CCD line sensor 8. This diffraction image changes its image forming position according to the diffraction angle at the grating 7 that is changed depending on a wavelength. The CCD line sensor 8 is thus enabled to detect the spectral of the light. The spectral detected by the CCD line sensor 8 is converted into a signal which is introduced into the personal computer 9. The personal computer 9 has a display device 10 connected thereto, and the spectral detected by the CCD line sensor 8 is displayed on this display device 10. Although the description of the high resolution spectrometer 4 has been made taking an example of a commonly used Czerny-Turner spectrometer, any other high resolution spectrometer may be used as long as it is capable of measuring E95 bandwidth sufficiently.

Description will be made of procedures of a spectral line width adjusting method.

In the first place, an upper limit $\Delta\lambda HL$ and a lower limit $\Delta\lambda LL$ are set for the E95 bandwidth common to narrow-band lasers used for semiconductor exposure. The upper limit $\Delta\lambda HL$ and the lower limit $\Delta\lambda LL$ are set within a range of E95 bandwidth allowed for the optical system of the semiconductor exposure tool.

Before using the narrow-band laser device 1 as a light source for the exposure tool, for example after the assembly of the narrow-band laser device 1 or directly after maintenance of the narrow-band laser device 1, the condenser lens 2, the optical fiber 3, the high resolution spectrometer 4, the personal computer 9, and the display device 10 are arranged outside the narrow-band laser device 1, as shown in FIG. 1. The narrow-band laser device 1 is then laser oscillated. During the laser oscillation, a spectral of the laser light is detected by the high resolution spectrometer 4, and is displayed on the display device 10.

Looking at the display device 10, the operator adjusts the E95 bandwidth adjustment unit 40 of the narrow-band laser device 1 such that the E95 bandwidth takes a value between the upper limit $\Delta\lambda HL$ and the lower limit $\Delta\lambda LL$. The E95 bandwidth varies in accordance with the adjustment of the E95 bandwidth adjustment unit 40. When the E95 bandwidth becomes a value between the upper limit $\Delta\lambda HL$ and the lower limit $\Delta\lambda LL$, the E95 adjustment unit 40 is fixed to terminate the adjustment of the E95 bandwidth.

Although, according to the embodiment shown in FIG. 1, the high resolution spectrometer 4 provided outside the narrow-band laser device 1 is used, a small-sized spectral detector may be used, providing the same within the narrow-band laser device 1. Further, the monitor 62 of the monitor module 60 provided in the narrow-band laser device 1 may be used.

Description will be made of specific configuration of the E95 bandwidth adjustment unit 40.

Figure 2A:
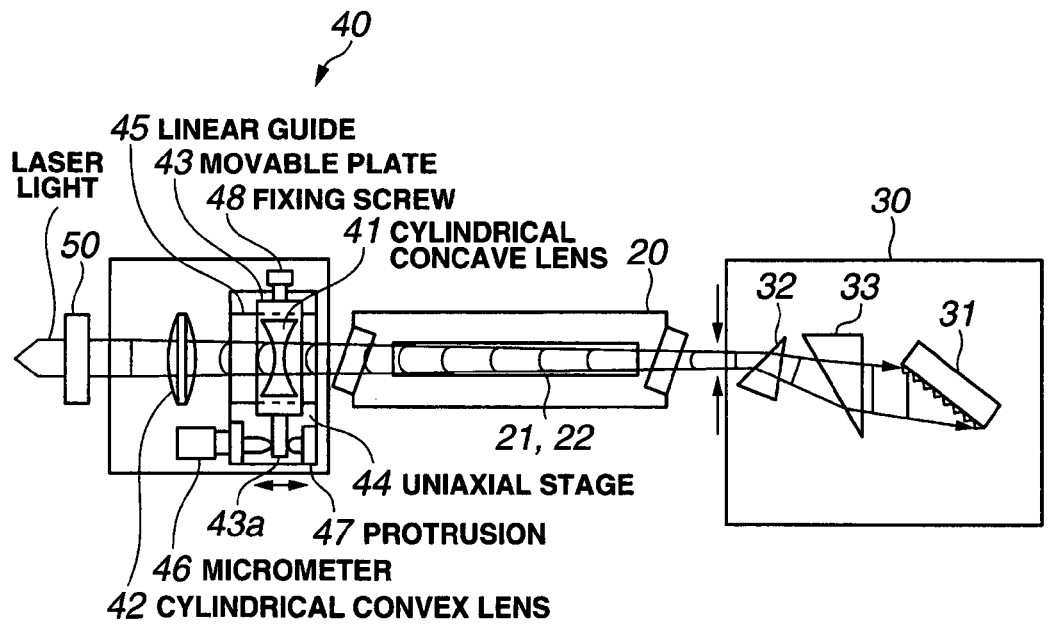
FIGS. 2(a) and 2(b) are diagrams showing a configuration of an E95 bandwidth adjustment unit and the positional relationship among an output coupler, the E95 bandwidth adjustment unit, a laser chamber, and a line narrowing module, according to a first embodiment of the invention.
Figure 2B:
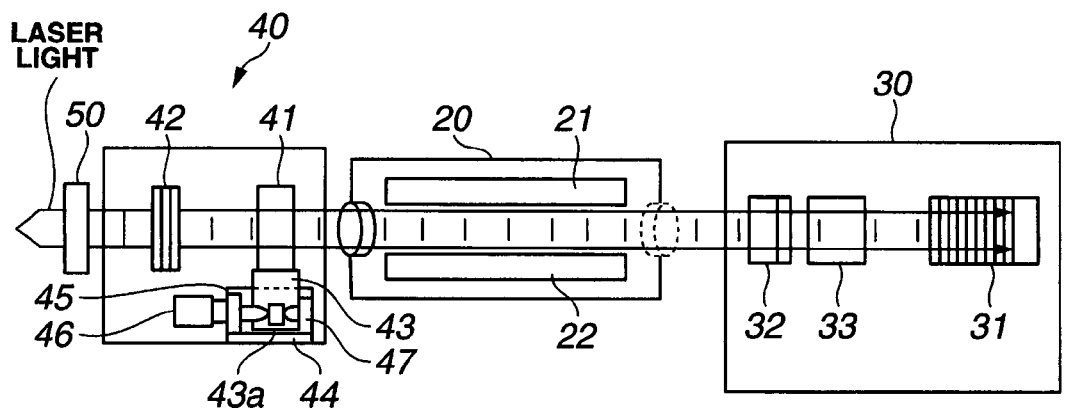

FIGS. 2(a) and 2(b) show configuration of the E95 bandwidth adjustment unit and positional relationship among the output coupler, the E95 bandwidth adjustment unit, the laser chamber, and the line narrowing module, according to the first embodiment. FIG. 2(a) is a plan view and FIG. 2(b) is a side view. The first embodiment is designed to adjust the optical wavefront by changing the distance between two lenses. The optical wavefront has a cylindrical shape. A straight line connecting the apex of the cylindrical shape is set approximately perpendicular to the wavefront dispersion surface of a wavelength selection element (grating) in the laser resonator, and the curvature of the cylindrical optical wavefront is varied, whereby the laser E95 bandwidth can be changed. The wavefront dispersion surface corresponds to an x-z plane in FIGS. 2(a) and 2(b), where the direction orthogonal to a multiplicity of grooves formed in the diffraction surface of the grating 31 is defined as the x axis, the direction parallel to the grooves formed in the diffraction surface of the grating 31 is defined as the y axis, and the direction orthogonal to the diffraction surface of the grating 31 is defined as the z axis.

The E95 bandwidth adjustment unit 40 shown in FIGS. 2(a) and 2(b) has a cylindrical concave lens 41 and a cylindrical convex lens 42 which face each other with a distance therebetween, the distance being freely adjustable. The cylindrical concave lens 41 and the cylindrical convex lens 42 are arranged such that central axes thereof are located on the optical path in the laser resonator, and such that mechanical axes thereof are approximately perpendicular to the wavefront dispersion surface of the grating 31. The central axes of the cylindrical concave lens 41 and cylindrical convex lens 42 are defined by a straight line connecting the centers of curvature radii of the cylindrical surfaces. The mechanical axis of the cylindrical concave lens 41 is defined by a straight line connecting the most recessed points in the lens. The mechanical axis of the cylindrical convex lens 42 is defined by a straight line connecting the most protruding point in the lens. The cylindrical concave lens 41 is fixed to the upper surface of a movable plate 43. The movable plate 43 is movable along a linear guide 45 formed on a uniaxial stage 44. The uniaxial stage 44 is arranged such that the direction in which the linear guide 45 is extended is parallel to the optical axis.

A convex portion 43a is formed on one side face of the movable plate 43 so as to protrude therefrom. The head of the micrometer 46 abuts on the front side of the convex portion 43a, while the head of a protrusion 47 abuts on the rear side of the convex portion 43a. The micrometer 46 is extendable and retractable in the direction in which the linear guide 45 is extended, and the extension of the micrometer 46 applies a pressing force to the convex portion 43a in the direction toward the protrusion 47. A spring which is extendable and retractable in the direction in which the linear guide 45 is extended is connected to the head of the protrusion 47, so that the spring applies an urging force to the convex portion 43a in the direction toward the micrometer 46. Consequently, the movable plate 43 is moved along linear guide 45 by extension or retraction of the micrometer 46.

A fixing screw 48 is provided on the other side of the movable plate 43. The fixing screw 48 is screwed in a through hole formed in the movable plate 43 so that the tip end thereof abuts on the linear guide 45. The movable plate 43 is fastened to the uniaxial stage 43 by tightening the fixing screw 48. The movable plate 43 is released by loosening the fixing screw 48. It should be understood that the fixing screw 48 may be omitted as long as the movable plate 43 can be sufficiently fixed to the uniaxial stage 43 by means of the micrometer 46 and the protrusion 47.

The E95 bandwidth adjustment unit 40, the laser chamber 20, and the line narrowing module 30 are arranged in orientation as shown in FIGS. 2(a) and 2(b). More specifically, the E95 bandwidth adjustment unit 40, the laser chamber 20, and the line narrowing module 30 are arranged such that the centers of the curvature radii of the cylindrical surfaces of the cylindrical concave lens 41 and cylindrical convex lens 42 provided in the line narrowing module 30 are located on the laser optical axis, and such that the mechanical axes of the cylindrical concave lens 41 and cylindrical convex lens 42 are parallel to the multiplicity of grooves formed in the diffraction surface of the grating 31.

Figure 3A:
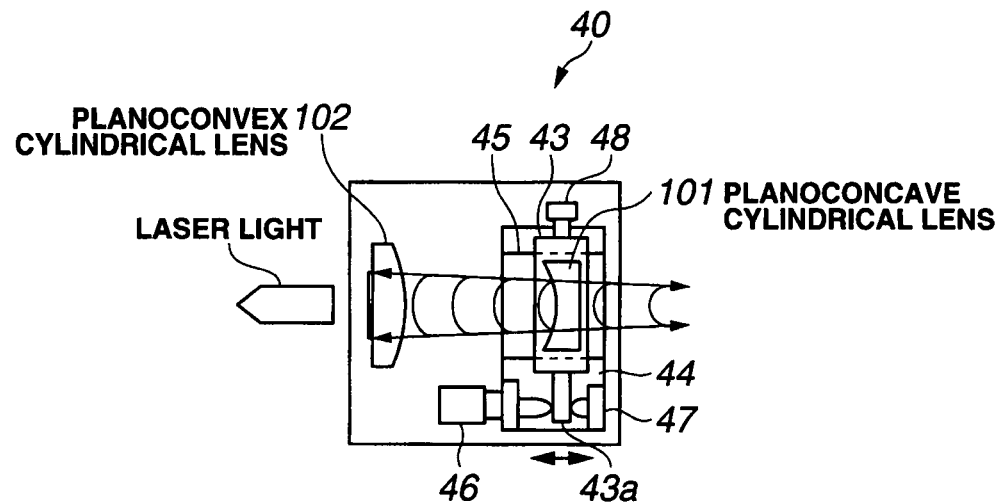
FIGS. 3(a) and 3(b) are diagrams showing a configuration of an E95 bandwidth adjustment unit according to a second embodiment of the invention.
Figure 3B:
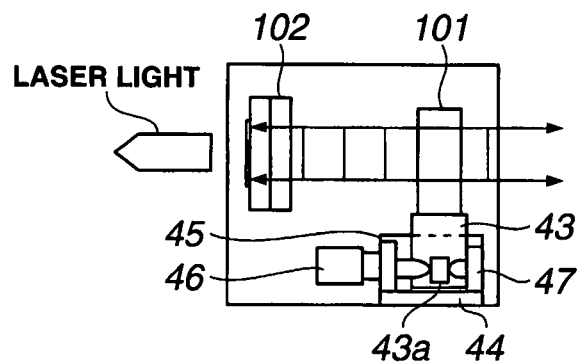

FIGS. 3(a) and 3(b) show configuration of an E95 bandwidth adjustment unit according to a second embodiment. FIG. 3(a) is a plan view and FIG. 3(b) is a side view. In the second embodiment, a planoconcave cylindrical lens 101 and a planoconvex cylindrical lens 102 are provided respectively in place of the cylindrical concave lens 41 and the cylindrical convex lens 42 shown in FIGS. 2(a) and 2(b). Configuration of the second embodiment is identical with that of the first embodiment shown in FIGS. 2(a) and 2(b), except for the planoconcave cylindrical lens 101 and the planoconvex cylindrical lens 102. In the second embodiment, the output coupler 50 shown in FIG. 1 is not required since the planoconvex cylindrical lens 102 functions as an output coupler. The incidence surface (the surface closer to the laser chamber) of the planoconvex cylindrical lens 102 is coated with an anti-reflection (AR) film, while the emission surface (the surface further from the laser chamber) is coated with a partial-reflection (PR) film. Similarly to the configuration shown in FIGS. 2(a) and 2(b), the centers of the curvature radii of the planoconcave cylindrical lens 101 and planoconvex cylindrical lens 102 are located on the laser optical axis, and the mechanical axes of the planoconcave cylindrical lens 101 and planoconvex cylindrical lens 102 are parallel to a multiplicity of grooves formed on the diffraction surface of the grating 31.

Figure 4:
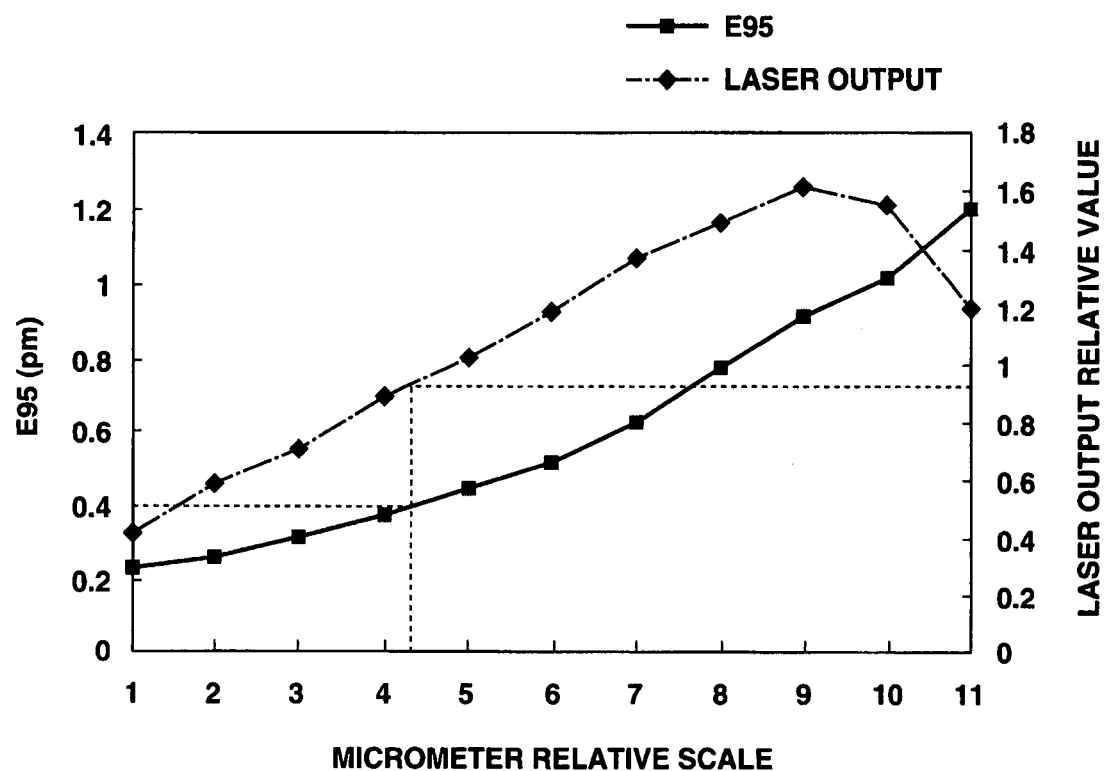
FIG. 4 is a diagram showing the relationship between a micrometer relative scale, an E95 bandwidth, and a laser output relative value when the E95 bandwidth adjustment unit according to the second embodiment is used.

FIG. 4 shows relationship among a micrometer relative scale, an E95 bandwidth, and a laser output relative value when the E95 bandwidth adjustment unit according to the second embodiment is used. In FIG. 4, the relative scale of the micrometer 46 (the axis of abscissa) of "1" corresponds to a state in which the planoconcave cylindrical lens 101 and the planoconvex cylindrical lens 102 are separated from each other by a predetermined distance. As the relative scale of the micrometer 46 increases, the planoconcave cylindrical lens 101 is separated further from the planoconvex cylindrical lens 102.

As seen from FIG. 4, the E95 bandwidth monotonically increases from 0.23 pm to 1.2 pm along with the increase of the micrometer relative scale. On the other hand, as the micrometer relative scale increases from 1 to 9, the laser output relative value monotonically increases from 0.42 to 1.63. As the micrometer relative scale increases from 9 to 11, the laser output monotonically decreases from 1.63 to 1.2.

When the target value of E95 bandwidth is set to 0.4 pm, for example, adjustment is made such that the relative scale of the micrometer 46 becomes 4.2. The laser output relative value is 0.95 in this state. Once the E95 bandwidth attains the target value, the fixing screw 48 is tightened to fix the movable plate 43.

Figure 5:
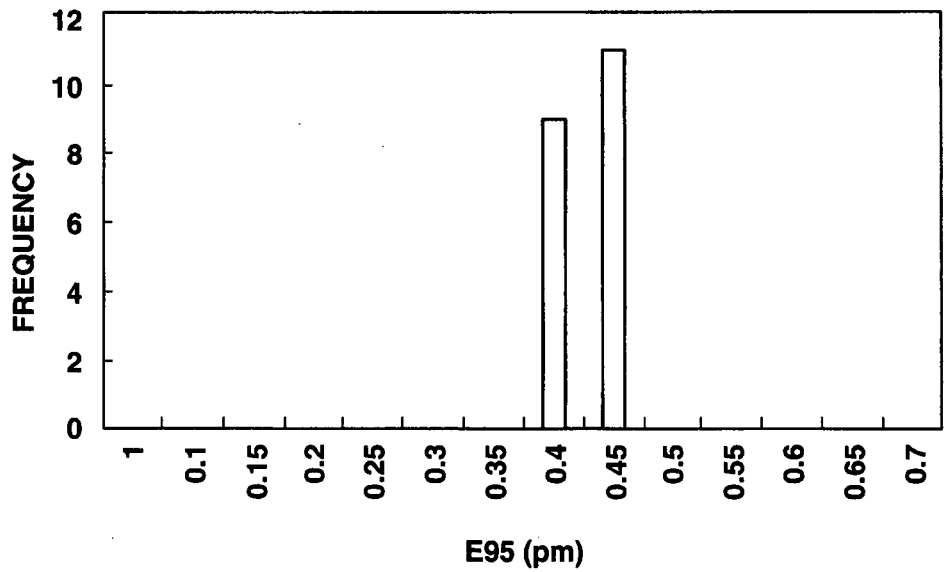
FIG. 5 is a histogram of E95 bandwidths due to laser machine differences when the E95 bandwidth adjustment unit according to the second embodiment is employed.

FIG. 5 is a histogram showing the E95 bandwidth varied due to laser machine differences when the E95 bandwidth adjustment unit according to the second embodiment is used.

A plurality of narrow-band laser devices were prepared as test samples. The lower limit $\Delta\lambda LL$ of the E95 bandwidth was set to 0.30 pm, while the upper limit $\Delta\lambda HL$ is set to 0.50 pm. The narrow-band laser devices were oscillated and the E95 bandwidth adjustment unit was adjusted so that the E95 bandwidth assumed a value between the upper limit $\Delta\lambda HL$ and the lower limit $\Delta\lambda LL$. The maximum value of the E95 bandwidth was 0.440 pm, the minimum value 0.360 pm, the mean value 0.405 pm, and the standard deviation was 0.029 pm. These variations due to the machine differences were effectively contained in the allowable E95 bandwidth range of from 0.350 pm to 0.450 pm.

Figure 6:
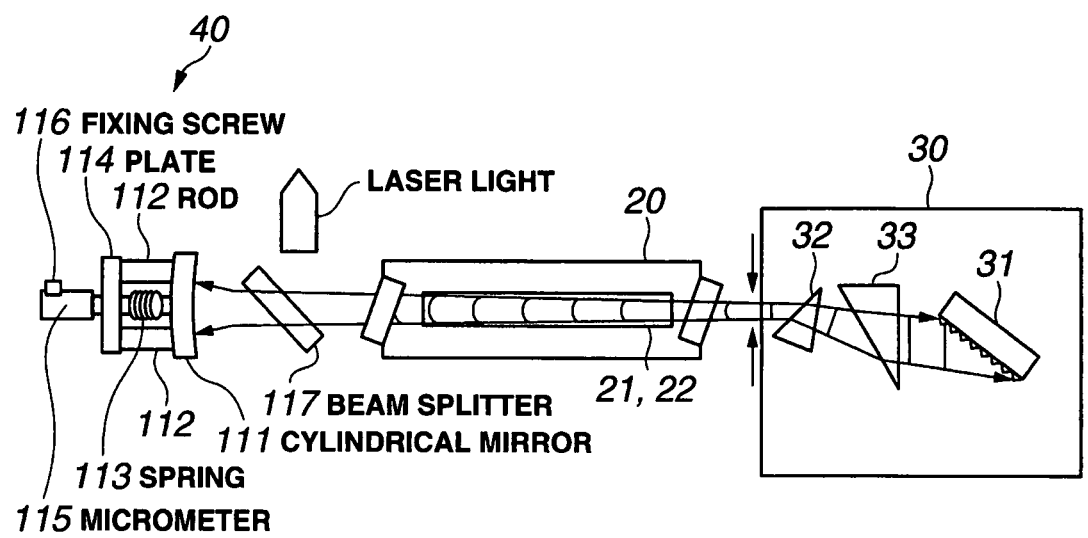
FIG. 6 is a diagram showing a configuration of an E95 bandwidth adjustment unit according to a third embodiment and positional relationship among the E95 bandwidth adjustment unit, a laser chamber and a line narrowing module.

FIG. 6 shows configuration of an E95 bandwidth adjustment unit according to a third embodiment and positional relationship among the E95 bandwidth adjustment unit, a laser chamber, and a line narrowing module. FIG. 6 is a plan view. The third embodiment is designed to adjust the optical wavefront by changing the curvature of a cylindrical mirror.

An E95 bandwidth adjustment unit 40 shown in FIG. 6 has a cylindrical mirror 111 the curvature of which is adjustable. In the third embodiment, a beam splitter 117 is arranged between the cylindrical mirror 111 and a laser chamber 20. The beam splitter 117 functions as an output coupler. Two rods 112 are connected, at one end thereof, to the opposite edges of the rear face of the cylindrical mirror 111. One end of a spring 113 is connected to the center of the rear face of the cylindrical mirror 111. The other ends of the two rods 112 are connected to a plate 114 arranged behind the cylindrical mirror 111, and the other end of the spring 113 is connected to the head of a micrometer 115 arranged behind the cylindrical mirror 111. The micrometer 115 is fixed to the plate 114. The micrometer 115 is provided with a fixing screw 116 for fixing the extension or retraction.

The cylindrical mirror 111 is arranged such that the center of the curvature radius of its cylindrical surface is located on the laser optical axis, and the mechanical axis of the cylindrical surface is parallel to a multiplicity of grooves formed in a diffraction surface of a grating 31 (i.e. substantially perpendicular to a wavefront dispersion surface of the grating 31). The definition of the mechanical axis of the cylindrical surface is the same as the definition of the mechanical axis of the cylindrical concave lens 41 described above.

When extended, the micrometer 115 pushes the center of the cylindrical mirror 111 by way of the spring 113. When retracted, the micrometer 115 pulls the center of the cylindrical mirror 111 by way of the spring 113. The curvature of the cylindrical surface of the cylindrical mirror 111 is adjusted in this manner.

Figure 7:
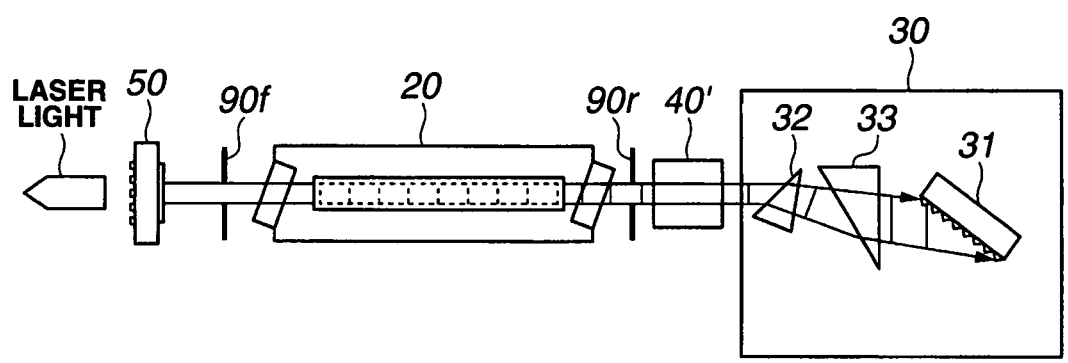
FIG. 7 is a diagram showing a state in which the E95 bandwidth adjustment unit is attached to the rear side of the laser chamber.

The description so far has been made regarding the configuration in which the E95 bandwidth adjustment unit is arranged on the front side of the laser chamber. However, as shown in FIG. 7, the E95 bandwidth adjustment unit may be arranged on the rear side of the laser chamber to adjust the E95 bandwidth. Description will be made of this embodiment.

Figure 8A:
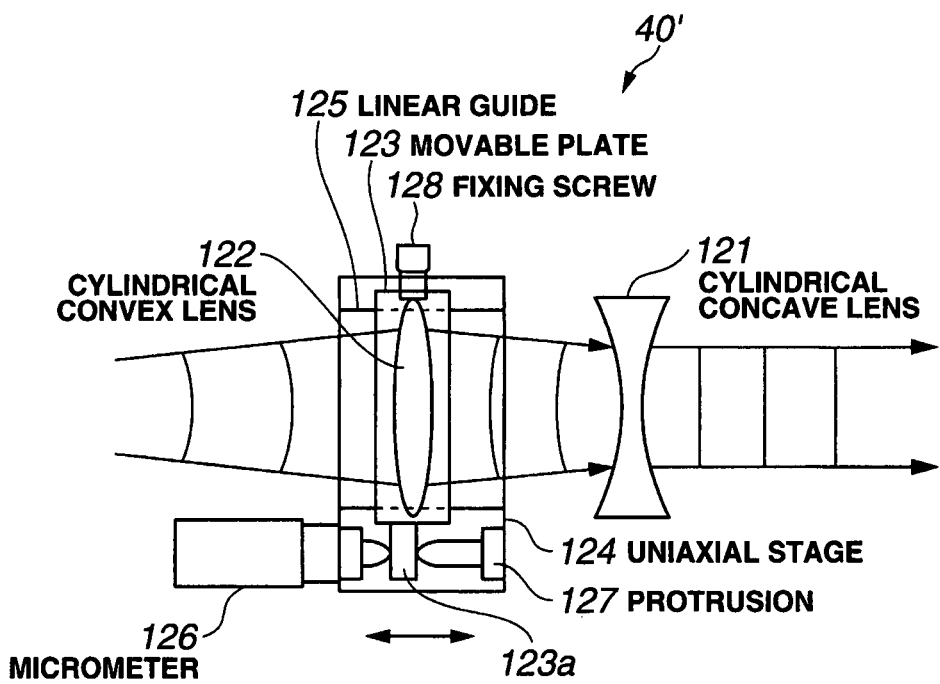
FIGS. 8(a) and 8(b) are diagrams showing a configuration of an E95 bandwidth adjustment unit according to a fourth embodiment of the invention.
Figure 8B:
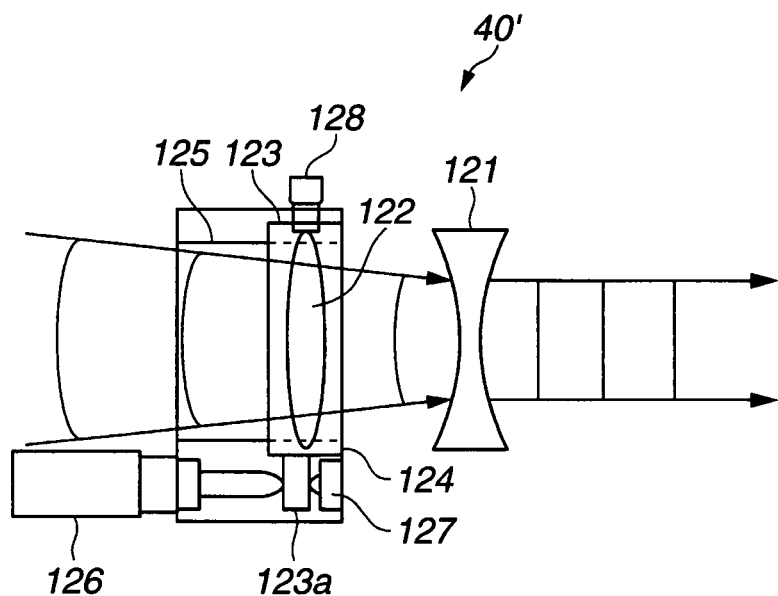

FIGS. 8(a) and 8(b) show a configuration of an E95 bandwidth adjustment unit according to a fourth embodiment. FIGS. 8(a) and 8(b) show a same E95 bandwidth adjustment unit but different patterns of wavefront adjustment. The configuration of the E95 bandwidth adjustment unit 40' shown in FIGS. 8(a) and 8(b) coincides, in many aspects, with that of the E95 bandwidth adjustment unit 40 shown in FIGS. 2(a) and 2(b). They are different only in that a cylindrical concave lens 121 is not fixed to a movable plate but a cylindrical convex lens 122 is fixed to the movable plate.

The E95 bandwidth adjustment unit 40' shown in FIGS. 8(a) and 8(b) has a cylindrical concave lens 121 and a cylindrical convex lens 122 facing each other with a distance which is adjustable. The cylindrical convex lens 122 is arranged on the rear side of the laser chamber 20 such that the center of the curvature radius of the cylindrical surface is located on the laser optical axis, and the mechanical axis of the cylindrical surface is parallel with a multiplicity of grooves formed on a diffraction surface of a grating 31 (i.e. such that the mechanical axis is substantially orthogonal to the wavefront dispersion surface). The cylindrical concave lens 121 is arranged on the rear side of the cylindrical convex lens 122 such that the center of the curvature radius of the cylindrical surface is located on the laser optical axis and the mechanical axis of the cylindrical surface is parallel with the multiplicity of grooves formed on the diffraction surface of the grating 31 (i.e., such that the mechanical axis is substantially orthogonal to the wavefront dispersion surface). The cylindrical convex lens 122 is fixed to the upper surface of a movable plate 123. The movable plate 123 is movable along a linear guide 125 formed on a uniaxial stage 124. The uniaxial stage 124 is arranged such that the direction in which the linear guide 125 extends is parallel to the optical axis.

A convex portion 123a is formed on one side of movable plate 123 so as to protrude therefrom. The head of a micrometer 126 abuts on the front face of the convex portion 123a, and the head of a protrusion 127 abuts on the rear face of the convex portion 123a. The micrometer 126 is extendable and retractable in the direction in which the linear guide 125 extends, and extension of the micrometer 126 applies a pressing force to the convex portion 123a in the direction towards the protrusion 127. The head of the protrusion 127 is connected to a spring which is extendable and retractable in the direction in which the linear guide 125 extends. This spring applies an urging force to the convex portion 123a in the direction towards the micrometer 126. Accordingly, the movable plate 123 is moved along the linear guide 125 by extension or retraction of the micrometer 126.

A fixing screw 128 is provided on the other side of the movable plate 123. The fixing screw 128 is screwed into a through hole formed in the movable plate 123 and the tip end of the screw abuts on the linear guide 125. The movable plate 123 is fixed to the uniaxial stage 123 by tightening the fixing screw 128. The movable plate 123 is released by loosening the fixing screw 128. It should be understood that the fixing screw 128 may be omitted as long as the movable plate 123 can be effectively fixed to the uniaxial stage 123 by means of the micrometer 126 and the protrusion 127.

Figure 9:
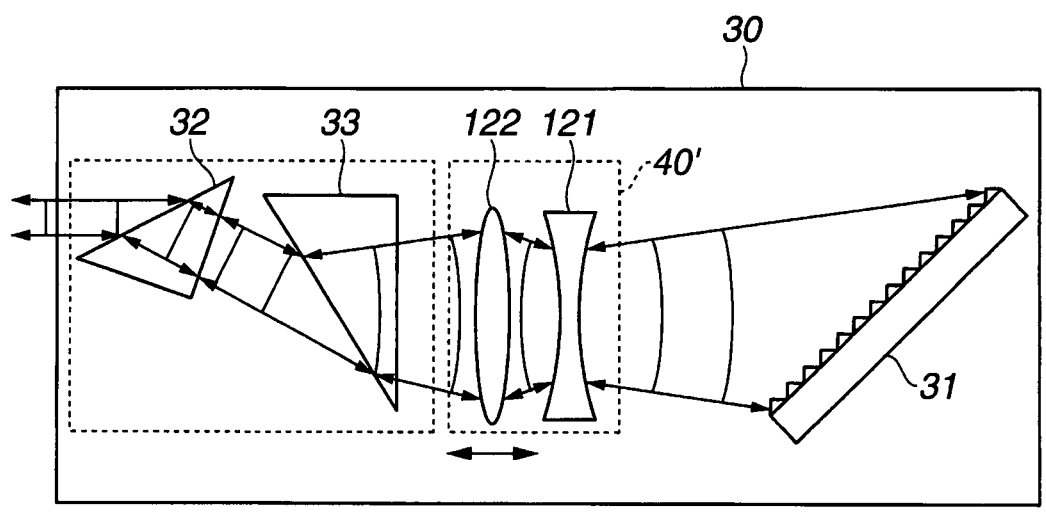
FIG. 9 is a diagram showing a state in which the E95 bandwidth adjustment unit according to the fourth embodiment is provided in a line narrowing module.

As shown in FIG. 9, the E95 bandwidth adjustment unit 40' shown in FIGS. 8(a) and 8(b) may be provided between a grating 31 and a prism 33 provided in the line narrowing module 30.

Figure 10A:
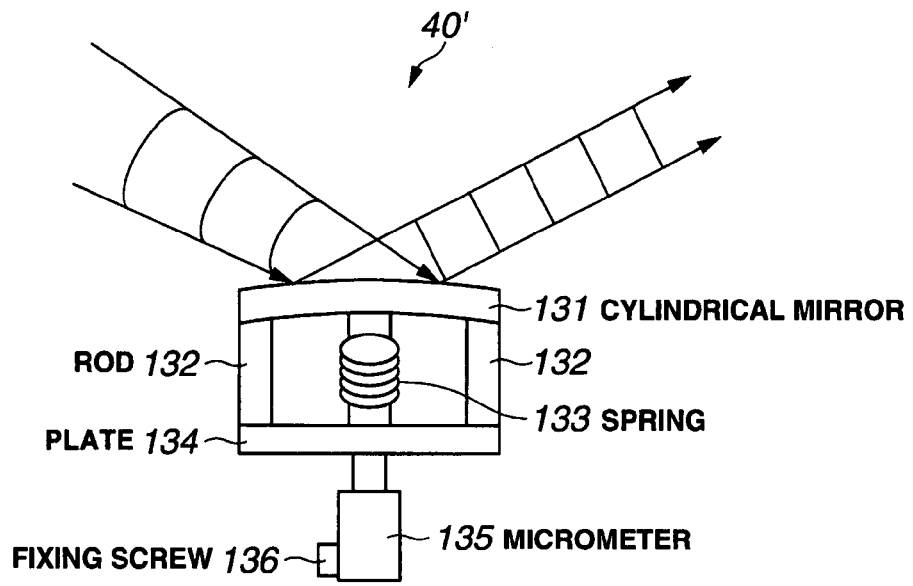
FIGS. 10(a) and 10(b) are diagrams showing a configuration of an E95 bandwidth adjustment unit according to a fifth embodiment of the invention.
Figure 10B:
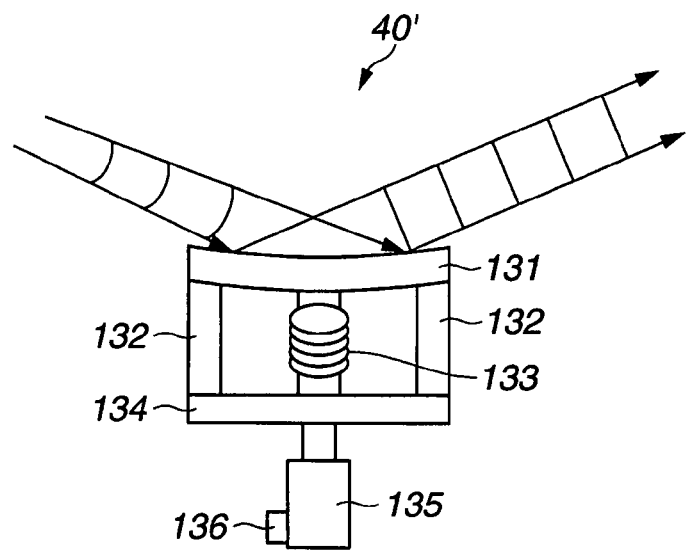

FIGS. 10(a) and 10(b) show configuration of an E95 bandwidth adjustment unit according to a fifth embodiment. FIGS. 10(a) and 10(b) show a same E95 bandwidth adjustment unit but different patterns of wavefront adjustment. The configuration of the E95 bandwidth adjustment unit 40' shown in FIGS. 10(a) and 10(b) coincides, in many aspects, with that of the E95 bandwidth adjustment unit 40 shown in FIG. 6. They are different only in that no beam splitter is provided and the optical incident direction is different from the reflection direction in the E95 bandwidth adjustment unit 40'.

The E95 bandwidth adjustment unit 40' shown in FIGS. 10(a) and 10(b) has a cylindrical mirror 131 the curvature of which is adjustable. Two rods 132 are connected, at one ends thereof, to the opposite edges of the rear face of the cylindrical mirror 131. One end of a spring 133 is connected to the center of the rear face of the cylindrical mirror 131. The other ends of the two rods 132 are connected to a plate 134 arranged behind the cylindrical mirror 131, and the other end of the spring 133 is connected to the head of a micrometer 135 arranged behind the cylindrical mirror 131. The micrometer 135 is fixed to the plate 134. The micrometer 135 is provided with a fixing screw 136 for fixing the extension or retraction.

The cylindrical mirror 131 is arranged in such an orientation that the incident direction of laser light is different from the reflection direction. The cylindrical mirror 131 is arranged such that the mechanical axis of the cylindrical surface is parallel with a multiplicity of grooves formed in the diffraction surface of a grating 31. The definition of the mechanical axis of the cylindrical surface is the same as the definition of the mechanical axis of the cylindrical concave lens 41 described above.

When extended, the micrometer 135 pushes the center of the cylindrical mirror 131 by way of the spring 133, and when retracted the micrometer 135 pulls the center of the cylindrical mirror 131 by way of the spring 133. The curvature of the cylindrical surface of the cylindrical mirror 131 is adjusted in this manner.

Figure 11:
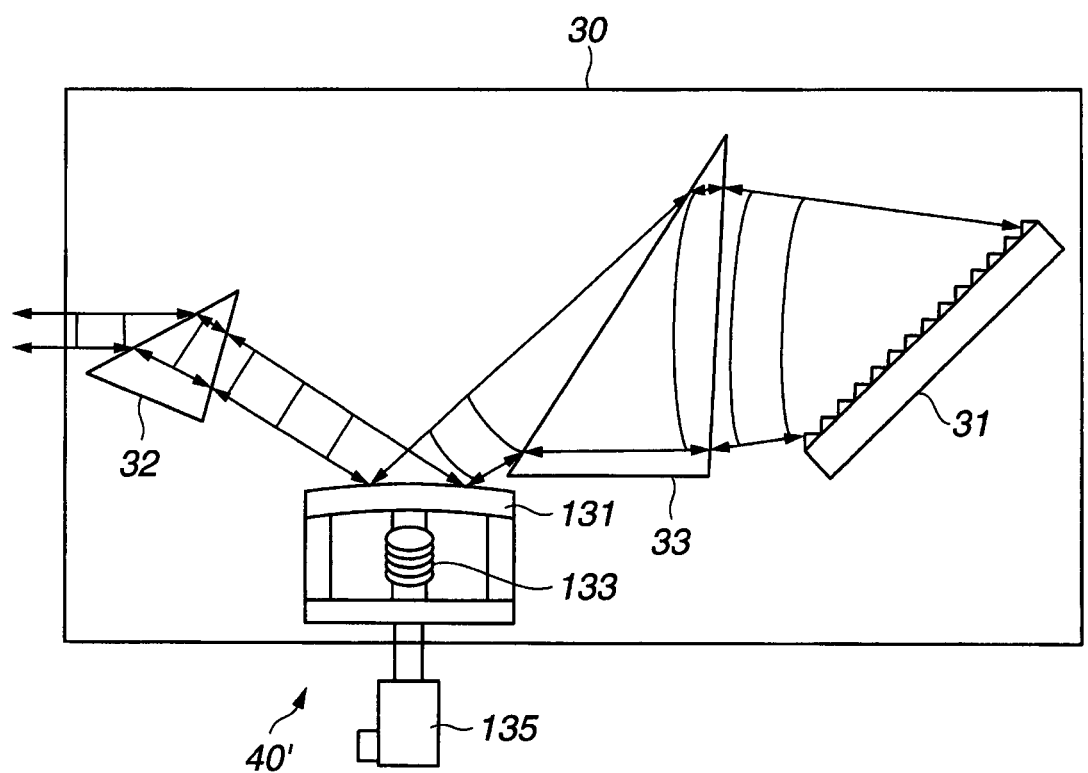
FIG. 11 is a diagram showing a state in which the E95 bandwidth adjustment unit according to the fifth embodiment is provided in a line narrowing module.

As shown in FIG. 11, the E95 bandwidth adjustment unit 40' shown in FIGS. 10(*a*) and 10(*b*) may be provided between a prism 32 and a prism 33 provided in the line narrowing module 30. In this case, it is desirable to provide an operating portion of the micrometer 135 outside the casing of the line narrowing module 30.

Figure 12:
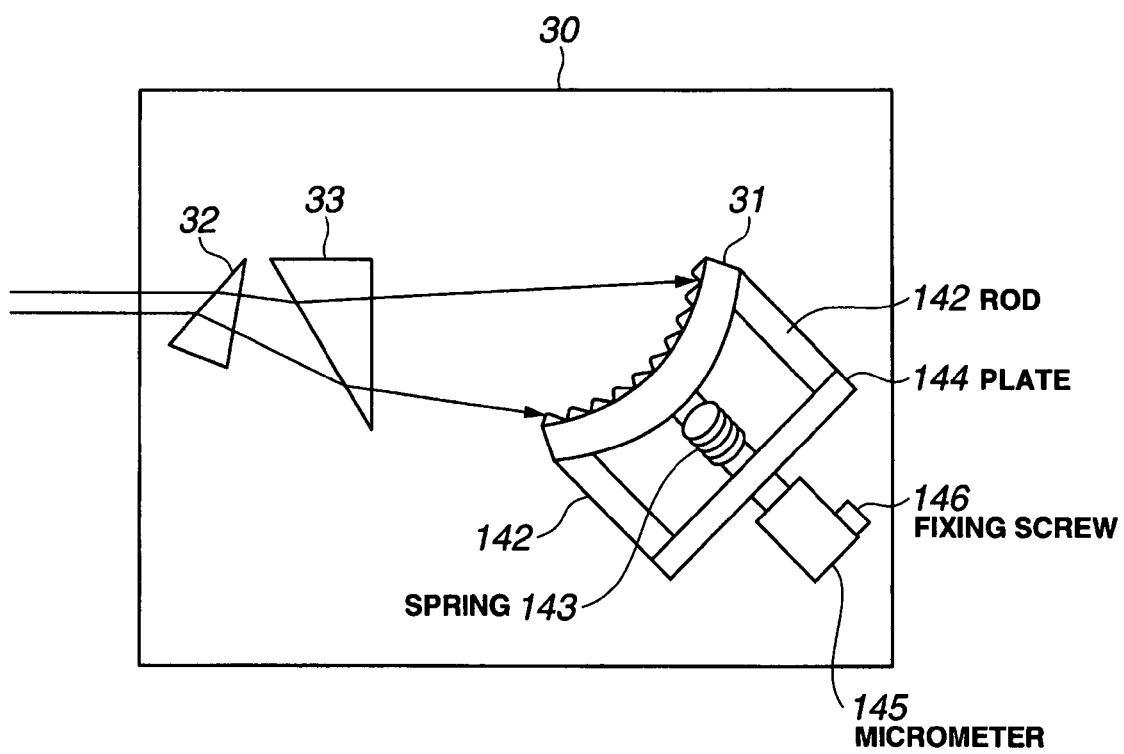
FIG. 12 is a diagram showing a configuration of an E95 bandwidth adjustment unit according to a sixth embodiment of the invention.

FIG. 12 shows configuration of an E95 bandwidth adjustment unit according to a sixth embodiment. The sixth embodiment is designed to adjust the optical wavefront by changing the curvature of a grating provided in a line narrowing module. The configuration of the micrometer or the like used in the third and fifth embodiments is applied to the adjustment of the curvature of the grating.

Two rods 142 are connected, at one ends thereof, to the opposite edges of the rear face of the grating 31. One end of a spring 143 is connected to the center of the rear face of the grating 31. The other ends of the two rods 142 are connected to a plate 144 arranged behind the grating 31, and the other end of the spring 143 is connected to the head of a micrometer 145 arranged behind the grating 31. The micrometer 145 is fixed to the plate 144. The micrometer 145 is provided with a fixing screw 146 for fixing the extension or retraction.

When extended, the micrometer 145 pushes the center of the grating 31 by way of the spring 143, and when retracted, the micrometer 145 pulls the center of the grating 31 by way of the spring 143. In this manner, the curvature of the diffraction surface is adjusted while keeping the multiplicity of the grooves of the grating 31 in linear shape.

Figure 13:
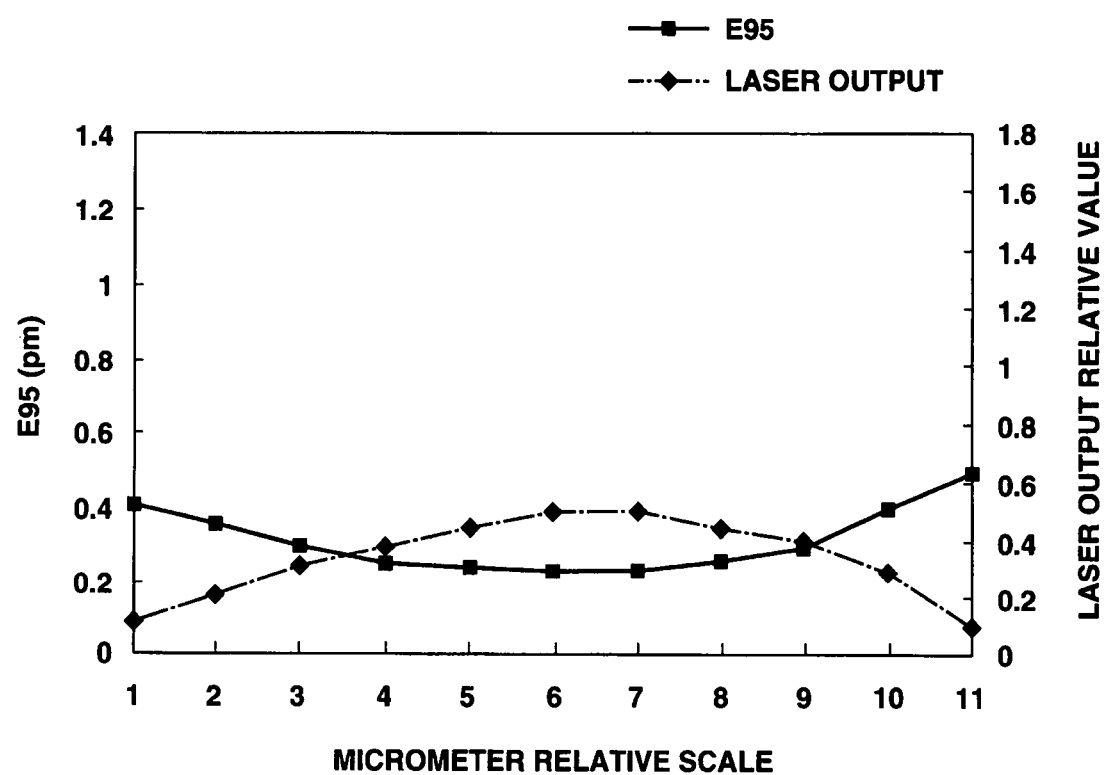
FIG. 13 is a diagram showing a relationship among a micrometer relative scale, an E95 bandwidth, and a laser output relative value when the E95 bandwidth adjustment unit according to the sixth embodiment is employed.

FIG. 13 shows relationship among a micrometer relative scale, an E95 bandwidth, and a laser output relative value when the E95 bandwidth adjustment unit according to the sixth embodiment is used. In FIG. 13, the relative scale of the micrometer 145 (the axis of abscissa) of "1" corresponds to a state in which the grating 31 has a predetermined curvature. As the relative scale of the micrometer 146 increases, the center of the grating 31 is pushed further out.

As seen from FIG. 13, as the micrometer relative scale increases from one to six, the E95 bandwidth monotonically decreases from 0.40 pm to 0.23 pm. As the micrometer relative scale increases from six to eleven, the E95 bandwidth monotonically increases from 0.23 pm to 0.5 pm. On the other hand, as the micrometer relative scale increases from one to six, the laser output relative value monotonically increases from 0.1 to 0.5, and as the micrometer relative scale increases from six to eleven, the laser output relative value monotonically decreases from 0.5 to 0.1.

When the target value of the E95 bandwidth is set to 0.4 pm, for example, the adjustment is made such that the relative scale of the micrometer 145 becomes one. The laser output relative value in this state is 0.1. Once the E95 bandwidth attains the target value, the fixing screw 146 is tightened to fix the micrometer 145.

It will be examined, on the basis of the result shown in FIG. 4 and the result shown in FIG. 13, which is more advantageous when the adjustment of the E95 bandwidth is made on the front side of the laser chamber or when made on the rear side. The laser output relative values in FIG. 4 and FIG. 13 are indicated on the same scale so that the laser output values can be compared relatively.

According to the configuration in which the E95 bandwidth adjustment unit is arranged on the front side of the laser chamber, as shown in FIG. 4, an advantageous characteristic is obtained that the E95 bandwidth monotonically increases along with the increase of the micrometer scale reading. Accordingly, it can be seen that the E95 bandwidth can be enlarged simply by extending the micrometer, whereas the E95 bandwidth can be narrowed simply by retracting the micrometer.

On the other hand, when the E95 bandwidth adjustment unit is arranged on the rear side of the laser chamber, as shown in FIG. 13, the E95 bandwidth monotonically increases along with the increase of the scale reading of the micrometer. However, once the scale reading of the micrometer has increased to some extent, the E95 bandwidth thereafter monotonically decreases along with the increase of the scale reading. Accordingly, it is impossible to determine how to operate the micrometer for enlarging or narrowing the E95 bandwidth, until the micrometer is actually operated to observe how the E95 bandwidth varies.

As a result, it can be concluded that the adjustment can be done easier when the E95 adjustment unit is arranged on the front side than on the rear side of the laser chamber. Further, comparing the laser output relative values of FIG. 4 and FIG. 13, it can be seen that greater laser output can be obtained when the E95 adjustment unit is arranged on the front side than on the rear side of the laser chamber. Thus, it can be concluded that it is more advantageous to perform adjustment of the E95 bandwidth on the front side of the laser chamber.

Figure 14:
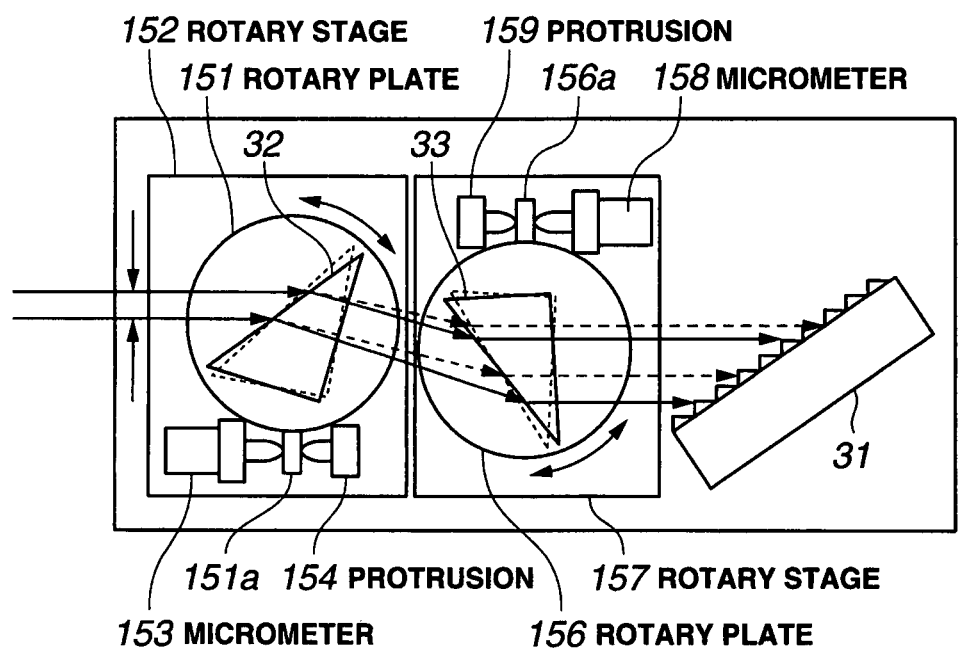
FIG. 14 is a diagram showing a configuration of an E95 bandwidth adjustment unit according to a seventh embodiment of the invention.

FIG. 14 shows configuration of an E95 bandwidth adjustment unit according to a seventh embodiment. The seventh embodiment is designed to adjust the expansion ratio of a beam entering a grating 31 by changing the rotation angle of a prism provided in a line narrowing module. When the incident beam is expanded in a direction perpendicular to the wavefront dispersion surface of the grating 31, the spread angle of the beam is reduced and hence the spectral line width is narrowed.

A prism 32 is fixed to a rotary plate 151, and the rotary plate 151 is rotatably supported by a rotary stage 152. A convex portion 151*a* is formed on a side face of the rotary plate 151 so as to protrude therefrom. The head of a micrometer 153 abuts on the front face of the convex portion 151*a*, and the head of a protrusion 154 abuts on the rear face of the convex portion 151*a*. The extension of the micrometer 153 gives a pressing force to the convex portion 151*a* in the direction towards the protrusion 154. A spring which is extendable and retractable is connected to the head of the protrusion 154, so that the urging force is given to the convex portion 151*a* by means of this spring in the direction towards the micrometer 153. Accordingly, the rotary plate 151 is rotated by extension and retraction of the micrometer 153.

A prism 33 is fixed to the rotary plate 156 in the same manner as the prism 32 is fixed to the rotary plate 151. Therefore, description thereof will be omitted.

In order to adjust the E95 bandwidth, the micrometer 153 is adjusted to rotate the rotary plate 151 and the prism 32, and the micrometer 158 is adjusted to rotate the rotary plate 156 and the prism 33, while ensuring not to change the laser oscillation wavelength. During this operation, the rotary plate 151 and the prism 32 are rotated in the opposite direction to the direction in which the rotary plate 156 and the prism 33 are rotated, while matching the rotation angles thereof, whereby the beam expansion ratio by the prisms 32 and 33 is changed. The E95 bandwidth becomes greater as the expansion ratio increases, and the E95 bandwidth becomes smaller as the expansion ratio decreases.

Figure 15:
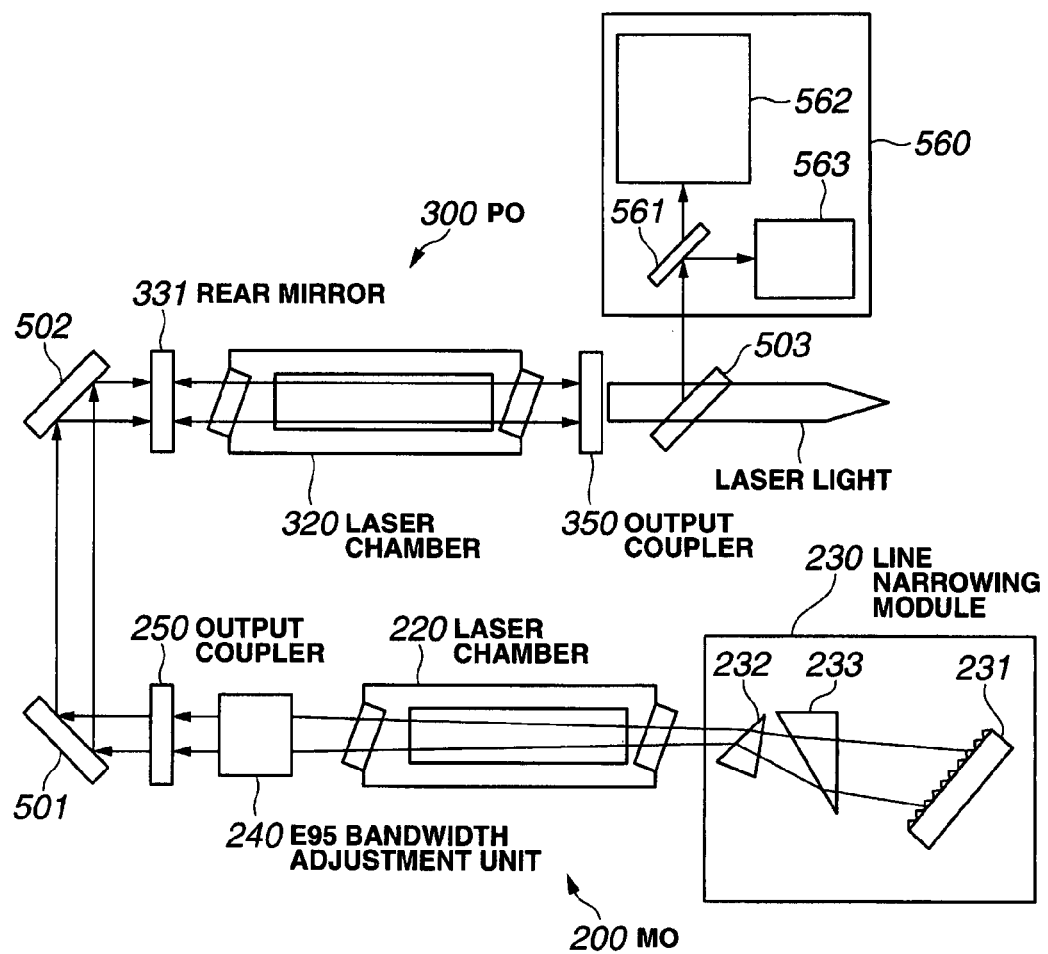
FIG. 15 is a diagram showing a state in which the E95 bandwidth adjustment unit is provided in a PO (amplification stage laser) of a double-chamber system.

It should be understood that, as shown in FIG. 15, the present invention is also applicable to adjustment of the E95 bandwidth in a narrow-band laser device having two laser chambers, so-called double-chamber system. Description will be made of configuration of an E95 bandwidth adjustment unit used in a double-chamber system.

For example, a double-chamber system includes an MO (oscillation stage laser) 200 for generating seed laser light and a PO (amplification stage laser) 300 for amplifying laser light output from the MO 200. In the MO 200, a line narrowing module 230 is arranged on the rear side of a laser chamber 220, and an output coupler 250 is arranged on the front side. The line narrowing module 230 is provided with a grating 231 and prisms 232 and 233. In the PO 300, a rear mirror 331 is arranged on the rear side of a laser chamber 320, and an output coupler 350 is arranged on the front side. In this embodiment, a rear mirror 331 is coated with a partial-reflection (PR) film having a reflectance of 80 to 90%, for example.

The MO 200 according to this embodiment has the output coupler 250, an E95 bandwidth adjustment unit, the laser chamber 220, and a line narrowing module 230. Laser light output by the MO 200 and having a narrow spectral line width is reflected by mirrors 501 and 502, and injected into the PO 300. In the PO 300, the seed laser light is introduced into the rear mirror 331 from the rear side thereof, and a part of the seed laser light is transmitted through the rear mirror 331. The transmitted seed light is amplified between the rear mirror 331, the laser chamber 320, and the output coupler 350 of the laser amplification stage to cause laser oscillation. Laser light output from the PO 300 is split by a beam splitter 503. One part of the laser light is output to the outside while the other part of the laser light is input to a monitor module 560. In the monitor module 560, the laser light is split by a beam splitter 561, an E95 bandwidth or a central wavelength is detected by a wavelength monitor 562, and pulse energy is detected by an energy monitor 563.

The configuration described above in relation to the first to seventh embodiments may be provided on the front side or rear side of the laser chamber 220 provided in the MO 200. FIG. 15 shows an arrangement in which the configuration of the first to third embodiments is applied to the double-chamber system.

Figure 16:
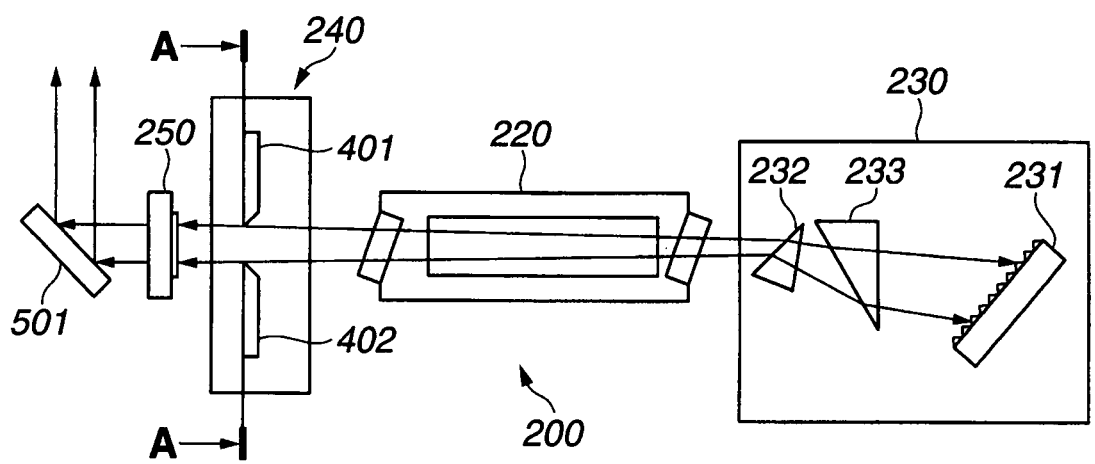
FIG. 16 is a diagram showing positional relationship among an E95 bandwidth adjustment unit, a laser chamber, and a line narrowing module according to an eighth embodiment of the invention.

FIG. 16 shows positional relationship among an E95 bandwidth adjustment unit, a laser chamber, and a line narrowing module according to an eighth embodiment. FIGS. 17(*a*) and 17(*b*) show configuration of an E95 bandwidth adjustment unit according to the eighth embodiment, as viewed in the direction indicated by A in FIG. 16. The eighth embodiment is designed to adjust a width of a slit.

The E95 bandwidth adjustment unit 240 has a slit formed by two blades 401 and 402 which are movable in the dispersion direction of a grating 231. The blades 401 and 402 are movably attached to a linear guide rail (not shown). The blade 401 is given an urging force in a direction toward the blade 402 by a plunger screw 403 having a spring incorporated therein. The blade 402 is given an urging force in a direction toward the blade 401 by a plunger screw 404 having a spring incorporated therein. The head of a triangular member 405 is inserted between the blade 401 and the blade 402. The triangular member 405 is a planar member having a thickness equivalent to that of the blades 401 and 402, and is movable in the direction parallel to the discharge direction of the laser chamber 220. The side faces of the triangular member 405 are slidably in contact with the blades 401 and 402, while the bottom face of the triangular member 405 is in contact with the head of a micrometer 406.

When the micrometer 406 is extended as shown in FIG. 17(*b*), the triangular member 405 advances between the blades 401 and 402. This causes the blades 401 and 402 to move in the directions separating from each other along the side faces of the triangular member 405. When the micrometer 406 is retracted as shown FIG. 17(*a*), the triangular member 405 is retracted from between the blades 401 and 402. This causes the blades 401 and 402 to move in the directions approaching to each other along the side faces of the triangular member 405. The slit width is varied in this manner.

Since the grating 231 is an angular dispersive element, the E95 bandwidth of the MO 200 can be adjusted by adjusting the region in which the MO 200 laser oscillates with respect to the dispersion direction. Although in the configuration shown in FIG. 16, the E95 bandwidth adjustment unit 240 according to the eighth embodiment is arranged on the front side of the laser chamber 220, the E95 bandwidth adjustment unit 240 according to the eighth embodiment may be arranged on the rear side of the laser chamber 220 or in the interior of the line narrowing module 230.

Figure 18:
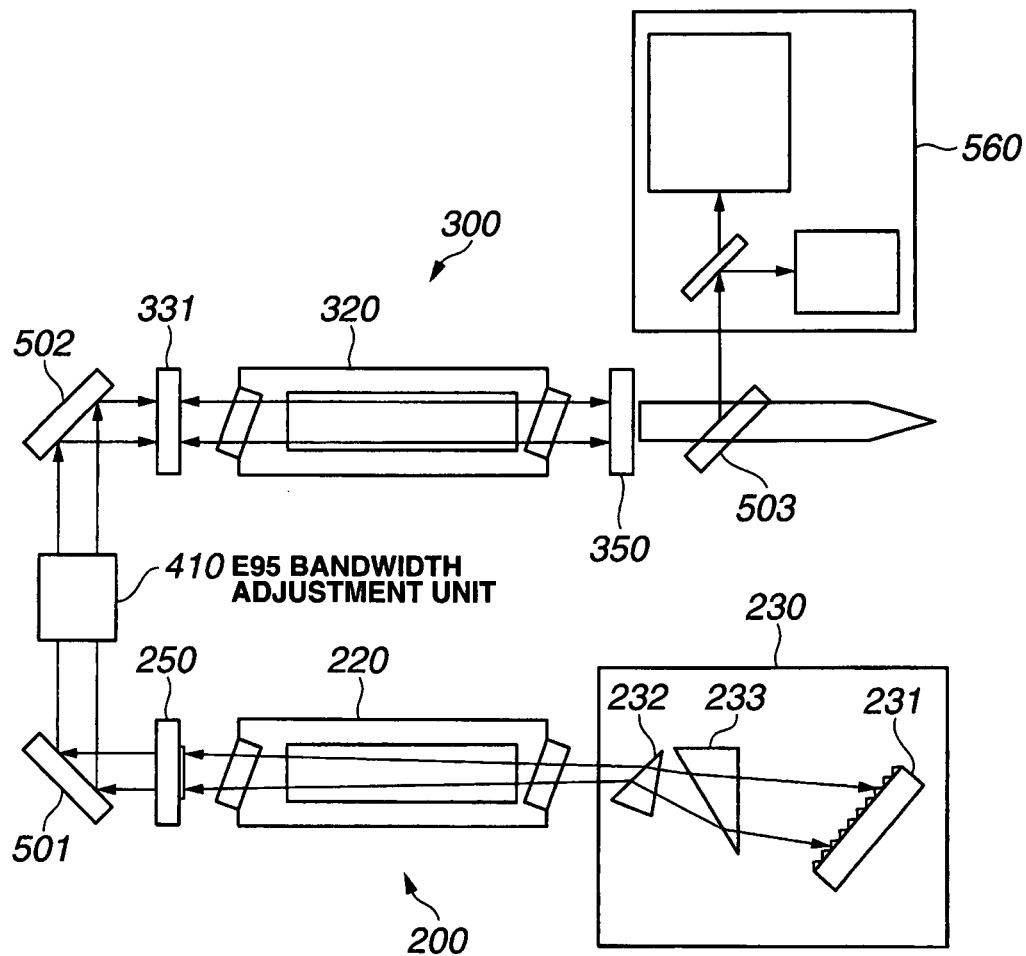
FIG. 18 is a diagram showing a state in which the E95 bandwidth adjustment unit is provided between a PO and an MO (oscillation stage laser) of a double-chamber system.

In the double-chamber system, as shown in FIGS. 18(*a*) and 2(*b*), the E95 bandwidth adjustment unit may be arranged on an optical path between the MO 200 and the PO 300.

Figure 19:
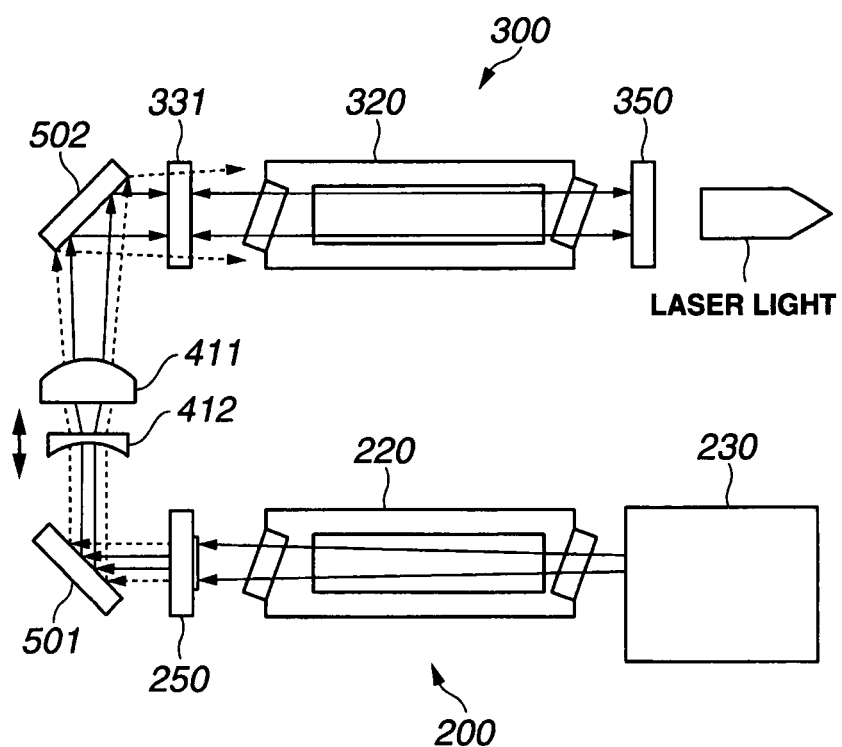
FIG. 19 is a diagram showing a state in which a cylindrical lens is arranged between the MO and the PO.

FIG. 19 shows an arrangement in which cylindrical lenses are arranged between the MO and the PO.

A planoconvex cylindrical lens 411 and a planoconcave cylindrical lens 412 are arranged on an optical path between the MO 200 and the PO 300 so as to face each other. Either the planoconvex cylindrical lens 411 or the planoconcave cylindrical lens 412 is movable along the optical axis. A moving mechanism for moving the lens may be the same as the one shown in FIGS. 2(*a*) and 2(*b*), for example. Further, a cylindrical convex lens and a cylindrical concave lens may be used in place of the planoconvex cylindrical lens 411 and the planoconcave cylindrical lens 412.

The spread of a beam injected into the PO 300 in the dispersion direction of a dispersive element (grating 231) mounted in the MO 200 can be adjusted by adjusting the distance between the planoconvex cylindrical lens 411 and the planoconcave cylindrical lens 412. As a result, the E95 bandwidth of laser light amplified and oscillated by the PO 300 can be varied. The E95 bandwidth becomes smaller when the beam is spread wider in the dispersion direction by adjusting the distance between the planoconvex cylindrical lens 411 and the planoconcave cylindrical lens 412. In contrast, the E95 bandwidth becomes greater when the beam spread is reduced with respect to the dispersion direction of the grating 231 by adjusting the distance between the planoconvex cylindrical lens 411 and the planoconcave cylindrical lens 412.

Figure 20:
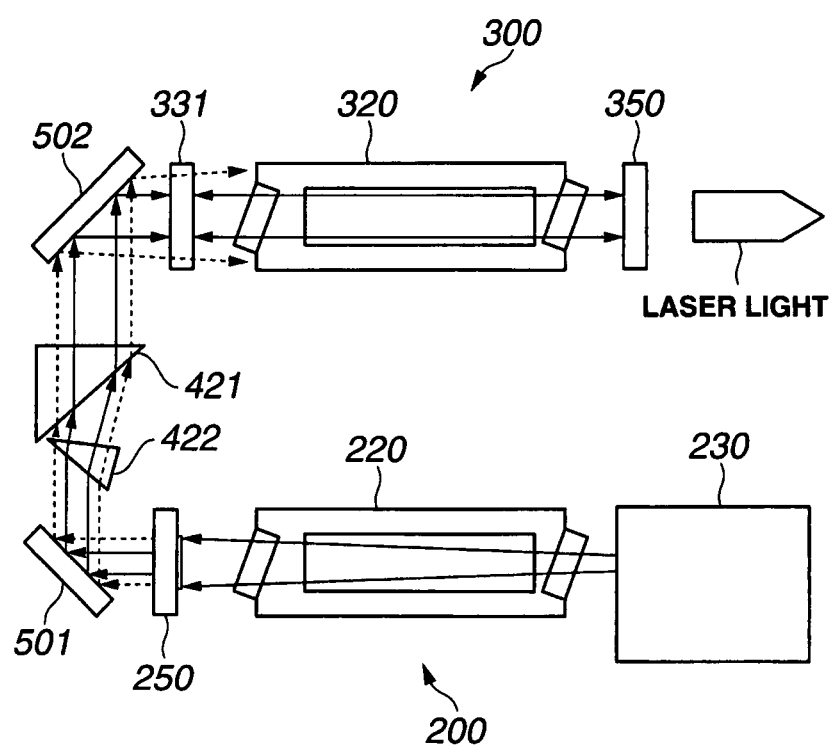
FIG. 20 is a diagram showing a state in which a prism is arranged between the MO and the PO.

FIG. 20 shows an arrangement in which prisms are arranged between the MO and the PO.

Two prisms 421 and 422 are arranged on an optical path between the MO 200 and the PO 300. The two prisms 421 and 422 are rotatable. A rotation mechanism for rotating the prisms may be the same as the mechanism shown in FIG. 14, for example.

The prisms 421 and 422 are rotated in opposite direction while matching the rotation angles thereof. Thus, the beam expansion ratio is varied by the prisms 421 and 422. The adjustment of the beam expansion ratio makes it possible to adjust the width of a beam injected into the PO 300 in the dispersion direction of a dispersive element (grating 231) mounted in the MO 200. As a result, the E95 bandwidth of laser light amplified and oscillated by the PO 300 can be varied. Specifically, the E95 bandwidth becomes smaller when the beam expansion ratio is increased by adjusting the rotation angle of the prisms 421 and 422. In contrast, the E95 bandwidth becomes greater when the beam expansion ratio is reduced with respect to the dispersion direction of the grating 231 by adjusting the rotation angle of the prisms 421 and 422.

Figure 21:
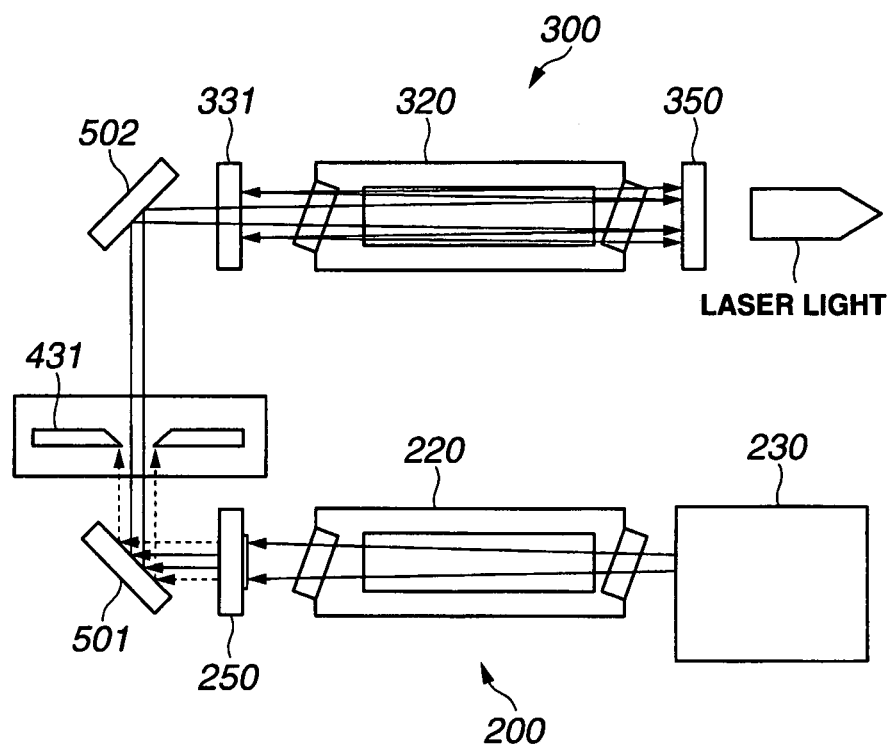
FIG. 21 is a diagram showing a state in which a slit is arranged between the MO and the PO.
Figure 22A:
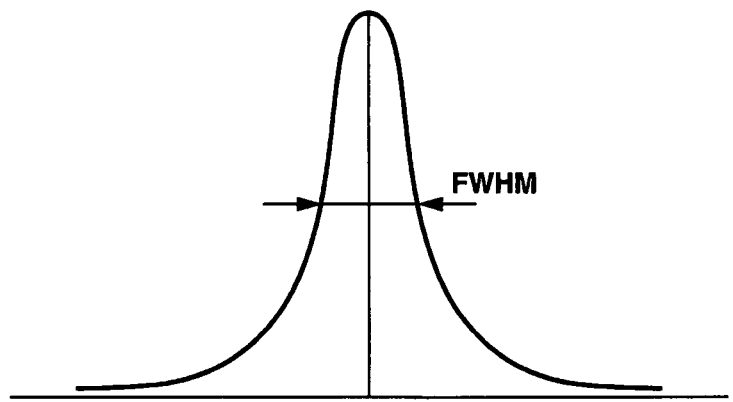
FIGS. 22(a) and 22(b) are diagrams for explaining the FWHM and the E95 bandwidth.
Figure 22B:
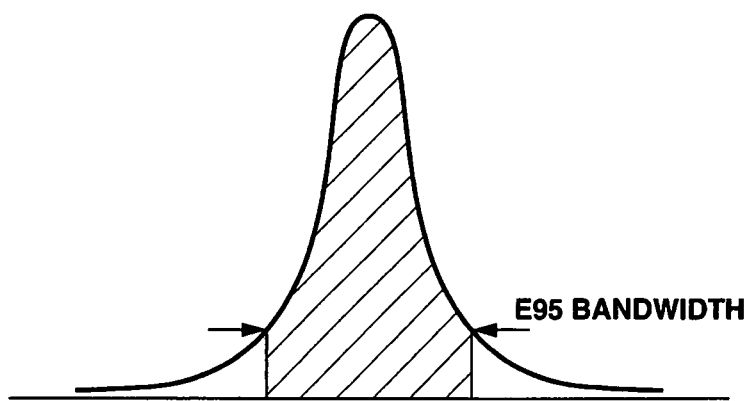
Figure 23:
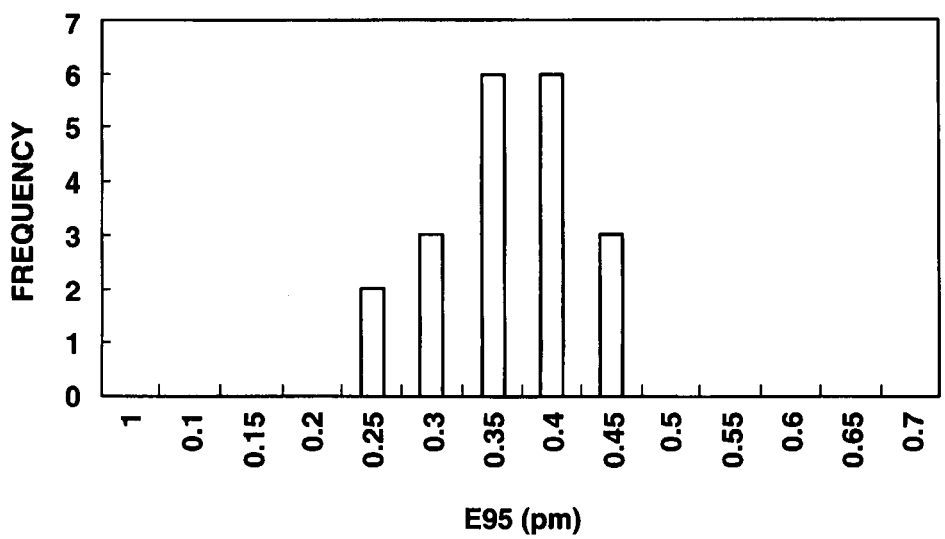
FIG. 23 is a histogram of E95 bandwidths due to laser machine differences according to conventional techniques.

FIG. 21 shows an arrangement in which a slit is arranged between the MO and the PO.

Figure 17A:
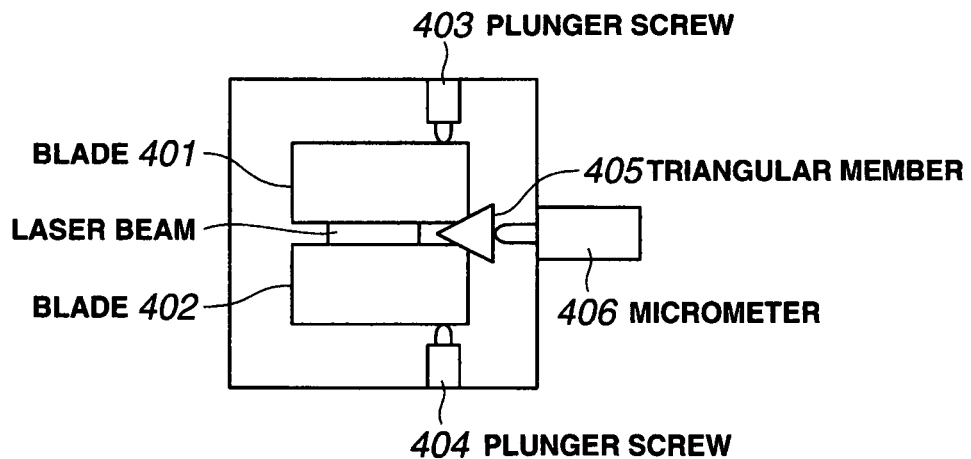
FIGS. 17(a) and 17(b) are diagrams showing a configuration of the E95 bandwidth adjustment unit according to the eighth embodiment.
Figure 17B:
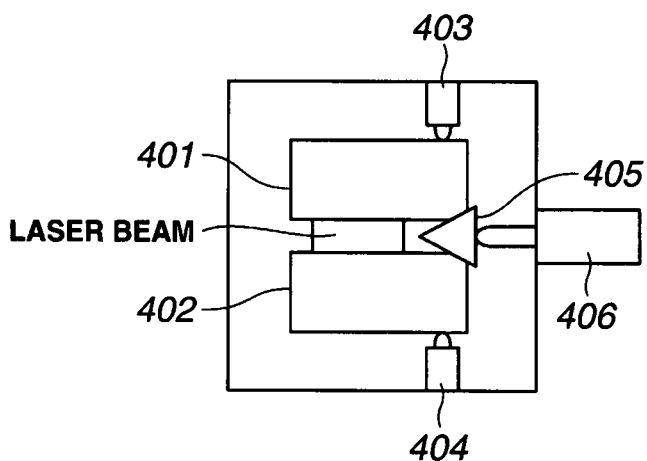

A slit 431 is arranged on an optical path between the MO 200 and the PO 300. The slit 431 may be the same one as shown in FIGS. 17(a) and 17(b), for example.

The E95 bandwidth of laser light amplified and oscillated by the PO 300 can be varied by adjusting the width of the slit 431. The E95 bandwidth becomes greater when the width of the slit 431 is increased. In contrast, the E95 bandwidth becomes smaller when the width of the slit 431 is reduced. Even if a beam injected into the PO 300 is narrower than a discharge width, output laser light can be spread out by causing the light to reciprocate through an optical resonator of the PO 300 as long as the beam has a spread angle.

It should be understood that the present invention is also applicable to a narrow-band laser device having three or more laser chambers. In this case as well, the E95 bandwidth adjustment unit may be provided in the MO or between the stages. Further, although the description above of the embodiments has been made taking the MOPO system as an example of the double-chamber system, the present invention is also applicable to an MOPA-type double-chamber system in which no laser resonator is provided in the amplification stage so that seed light is directly amplified.

According to the present invention, the deviation in spectral line width such as E95 bandwidth among the laser devices can be minimized. Further, also in a same laser device, the deviation in spectral line width such as E95 bandwidth before and after the maintenance of the device can be minimized. Therefore, the spectral line width of laser light output from the laser device will not exceed the allowable range of the spectral line width such as E95 bandwidth for an optical system of the exposure tool. This makes it possible to stabilize the quality of integrated circuit patterns formed by the semiconductor exposure tool, and thus the yield of semiconductor devices can be improved. Furthermore, the yield of laser production and the yield in maintenance are improved, whereby the laser production cost and the maintenance cost can be reduced effectively.

What is claimed is:

1. A narrow-band laser spectral line width adjustment method for adjusting the spectral line width of laser light emitted from a narrow-band laser device being used as a light source for semiconductor exposure, the method comprising:
    setting in advance an upper limit and a lower limit for a spectral line width allowed in semiconductor exposure;
    before semiconductor exposure and after said setting the upper limit and lower limit for the spectral line width, emitting the laser light from the narrow-band laser device;
    after said emitting the laser light and before semiconductor exposure, detecting the spectral line width of the laser light using a monitor module arranged on an optical path of the laser light; and
    after said detecting the spectral line width of the laser light and before semiconductor exposure, adjusting, based on the detected spectral line width, a distance between a cylindrical concave lens and a cylindrical convex lens arranged on an optical path at a front side inside a resonator of the narrow-band laser device by using a micrometer to set the spectral line width to a value between the upper limit and the lower limit.

2. The narrow-band laser spectral line width adjustment method of claim 1,
    wherein central axes of the cylindrical concave lens and the cylindrical convex lens are respectively arranged on the optical path at the front side inside the laser resonator and mechanical axes thereof are respectively arranged so as to be parallel to a multiplicity of grooves of a grating arranged inside the resonator of the narrow-band laser device,
    wherein either the cylindrical concave lens or the cylindrical convex lens is fixed on a movable plate, and
    wherein said adjusting the distance between the cylindrical concave lens and the cylindrical convex lens includes moving the movable plate on a stage configured to be movable in parallel to the optical path.

3. The narrow-band laser spectral line width adjustment method of claim 2, further comprising:
    fixing the movable plate on the stage with a fixing screw after the distance between the cylindrical concave lens and the cylindrical convex lens is adjusted using the micrometer.

4. The narrow-band laser spectral line width adjustment method of claim 1,
    wherein the narrow-band laser device comprises an oscillation stage laser for outputting the laser light, and one or more amplification stage chambers or amplification stage lasers for receiving, amplifying and outputting the laser light output from the oscillation stage laser, and
    wherein the cylindrical concave lens and the cylindrical convex lens are arranged on a the laser optical path at the front side inside the laser resonator of the oscillation stage laser.

5. The narrow-band laser spectral line width adjustment method of claim 4, wherein the monitor module is arranged in an output unit of the amplification stage chamber or the amplification stage laser.

6. The narrow-band laser spectral line width adjustment method of claim 1, further comprising:
    detecting a spectrum line width of the laser device after maintenance is performed on the laser device.

7. The narrow-band laser spectral line width adjustment method of claim 1, wherein said setting operation includes setting the spectral line width of the laser device to a value between an upper limit and a lower limit.

8. The narrow-band laser spectral line width adjustment method of claim 1, wherein variation in spectral line width is suppressed by setting the spectral line width of the laser device to the value between the upper limit and the lower limit.

9. The narrow-band laser spectral line width adjustment method of claim 1, wherein said adjusting operation includes adjusting the spectral line width from a value below the lower limit to a value above the lower limit.

10. The narrow-band laser spectral line width adjustment method of claim 1, wherein the upper limit and the lower limit are set based on a target value of the spectral line width.

11. The narrow-band laser spectral line width adjustment method of claim 1, wherein the narrow-band laser device is a KrF excimer laser or an ArF excime laser.

12. The narrow-band laser spectral line width adjustment method of claim 1, wherein said setting operation includes setting the upper limit and the lower limit for the spectral line width common to a plurality of narrow band laser devices.

13. The narrow-band laser spectral line width adjustment method of claim 12, wherein the lower limit is greater than a minimum value of the spectral line width of the laser device.

14. The narrow-band laser spectral line width adjustment method of claim 1, wherein the lower limit is greater than a minimum value of the spectral line width of the laser device.

15. The narrow-band laser spectral line width adjustment method of claim 1, wherein the spectral line width is E95 width.

16. A narrow-band laser spectral line width adjustment method for adjusting the spectral line width of laser light emitted from a narrow-band laser device being used as a light source for semiconductor exposure, the method comprising:
   performing maintenance on the narrow-band laser device;
   setting in advance an upper limit and a lower limit for a spectral line width allowed in semiconductor exposure;
   after said maintenance and said setting the upper limit and lower limit for the spectral line width, and before semiconductor exposure, emitting the laser light from the narrow-band laser device;
   after said emitting the laser light and before semiconductor exposure, detecting the spectral line width of the laser light using a monitor module arranged on an optical path of the laser light; and
   after said detecting the spectral line width of the laser light and before semiconductor exposure, adjusting, based on the detected spectral line width, a distance between a cylindrical concave lens and a cylindrical convex lens arranged on an optical path at a front side inside a resonator of the narrow-band laser device by using a micrometer to set the spectral line width to a value between the upper limit and the lower limit.

17. The narrow-band laser spectral line width adjustment method of claim 16, wherein the spectral line width is E95 width.

18. A narrow-band laser spectral line width adjustment method for adjusting the spectral line width of laser light emitted from a narrow-band laser device being used as a light source for semiconductor exposure, the method comprising:
   assembling the narrow-band laser device;
   setting in advance an upper limit and a lower limit for a spectral line width allowed in semiconductor exposure;
   after said assembling and said setting the upper limit and the lower limit, and before semiconductor exposure, emitting the laser light from the narrow-band laser device;
   after said emitting the laser light and before semiconductor exposure, detecting the spectral line width of the laser light using a monitor module arranged on an optical path of the laser light; and
   after said detecting the spectral line width of the laser light and before semiconductor exposure, adjusting, based on the detected spectral line width, a distance between a cylindrical concave lens and a cylindrical convex lens arranged on the optical path at a front side inside a resonator of the narrow-band laser device by using a micrometer to set the spectral line width to a value between the upper limit and the lower limit.

19. The narrow-band laser spectral line width adjustment method of claim 18, wherein the spectral line width is E95 width.

* * * * *